US008823092B2

(12) United States Patent
Yamazaki

(10) Patent No.: US 8,823,092 B2
(45) Date of Patent: Sep. 2, 2014

(54) SEMICONDUCTOR DEVICE AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 126 days.

(21) Appl. No.: 13/297,480

(22) Filed: Nov. 16, 2011

(65) Prior Publication Data

US 2012/0132905 A1 May 31, 2012

(30) Foreign Application Priority Data

Nov. 30, 2010 (JP) ................................ 2010-267908

(51) Int. Cl.
H01L 29/66 (2006.01)
H01L 21/84 (2006.01)

(52) U.S. Cl.
USPC .......................................... 257/335; 438/162

(58) Field of Classification Search
USPC ............. 438/64–67, 325, 335, 104, 162, 479, 438/519; 257/37, 162, 43, 325, 257/E21.135–E21.153
See application file for complete search history.

(56) References Cited

U.S. PATENT DOCUMENTS

| 5,528,032 A | 6/1996 | Uchiyama |
| 5,625,202 A | 4/1997 | Chai |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| EP | 1 557 889 A | 7/2005 |
| EP | 1 737 044 A | 12/2006 |

(Continued)

OTHER PUBLICATIONS

International Search Report (Application No. PCT/JP2010/069872) dated Feb. 8, 2011.

(Continued)

Primary Examiner — Calvin Lee
(74) Attorney, Agent, or Firm — Eric J. Robinson; Robinson Intellectual Property Law Office, P.C.

(57) ABSTRACT

An object is to provide a transistor in which the state of an interface between an oxide semiconductor layer and an insulating film (gate insulating layer) in contact with the oxide semiconductor layer is favorable; and a method for manufacturing the transistor. In order to obtain the transistor, nitrogen is added to a region of the oxide semiconductor layer in the vicinity of the interface with the gate insulating layer. Specifically, a concentration gradient of nitrogen is formed in the oxide semiconductor layer, and a region containing much nitrogen is provided at the interface with the gate insulating layer. By the addition of nitrogen, a region with high crystallinity can be formed in the region of the oxide semiconductor layer in the vicinity of the interface with the gate insulating layer, so that a stable interface state can be obtained.

20 Claims, 12 Drawing Sheets

(56) References Cited

U.S. PATENT DOCUMENTS

| | | |
|---|---|---|
| 7,105,868 B2 | 9/2006 | Nause et al. |
| 7,157,307 B2 | 1/2007 | Ishizaki |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 * | 6/2010 | Akimoto et al. ............... 257/72 |
| 7,893,495 B2 | 2/2011 | Li et al. |
| 7,910,490 B2 | 3/2011 | Akimoto et al. |
| 8,338,827 B2 | 12/2012 | Yamazaki et al. |
| 8,378,393 B2 | 2/2013 | Sakata et al. |
| 8,432,187 B2 * | 4/2013 | Kato et al. ............... 326/46 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017261 A1 | 1/2005 | Ishizaki |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0056984 A1 | 3/2008 | Yoshioka et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123130 A1 | 5/2010 | Akimoto et al. |
| 2010/0163874 A1 | 7/2010 | Koyama et al. |
| 2010/0252832 A1 * | 10/2010 | Asano et al. ............... 257/57 |
| 2011/0062436 A1 | 3/2011 | Yamazaki et al. |
| 2011/0068335 A1 | 3/2011 | Yamazaki et al. |
| 2011/0084271 A1 | 4/2011 | Yamazaki et al. |
| 2011/0108837 A1 | 5/2011 | Yamazaki et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0133180 A1 | 6/2011 | Yamazaki |
| 2011/0151618 A1 | 6/2011 | Yamazaki et al. |
| 2012/0132903 A1 | 5/2012 | Yamazaki et al. |
| 2012/0132904 A1 | 5/2012 | Yamazaki |

FOREIGN PATENT DOCUMENTS

| | | |
|---|---|---|
| EP | 2 120 267 A | 11/2009 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-153062 A | 5/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-278115 A | 11/2009 |
| WO | WO 2004/114391 | 12/2004 |
| WO | WO 2009/034953 | 3/2009 |

OTHER PUBLICATIONS

Written Opinion (Application No. PCT/JP2010/069872) dated Feb. 8, 2011.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

(56) References Cited

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds In$MO_3$(ZnO)$m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the $16^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 IN. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

(56) References Cited

OTHER PUBLICATIONS

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Ai; B: Mg, Mn, Fe, Ni, Cu, or Zn] at Temperatures Over 1000° C." Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

VOrita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

* cited by examiner wurtzite structure wurtzite structure

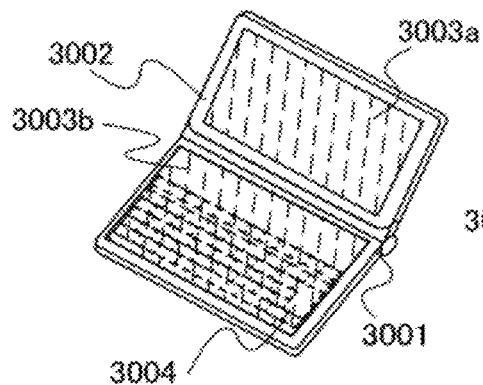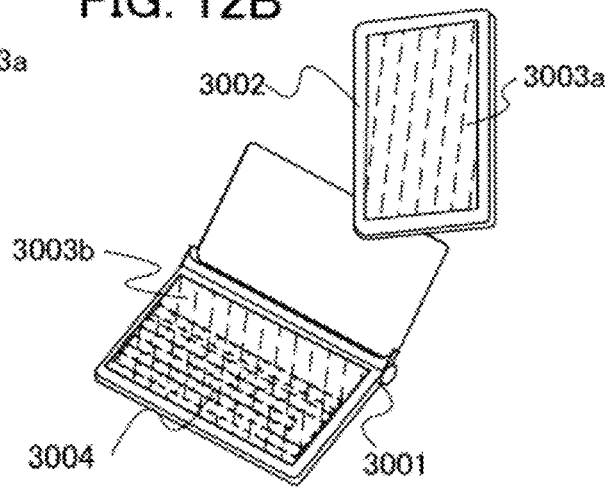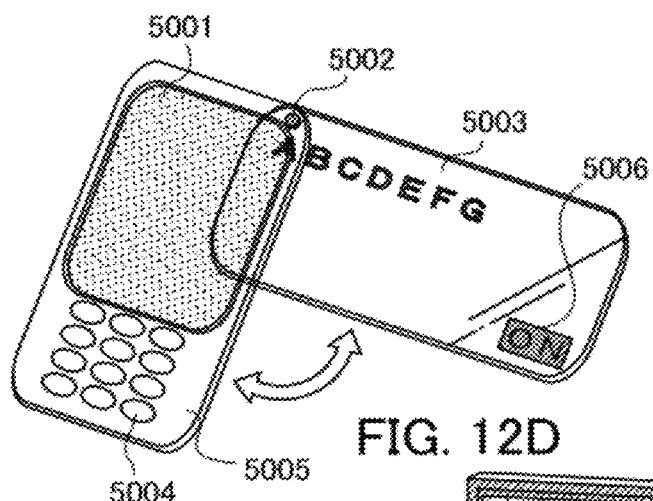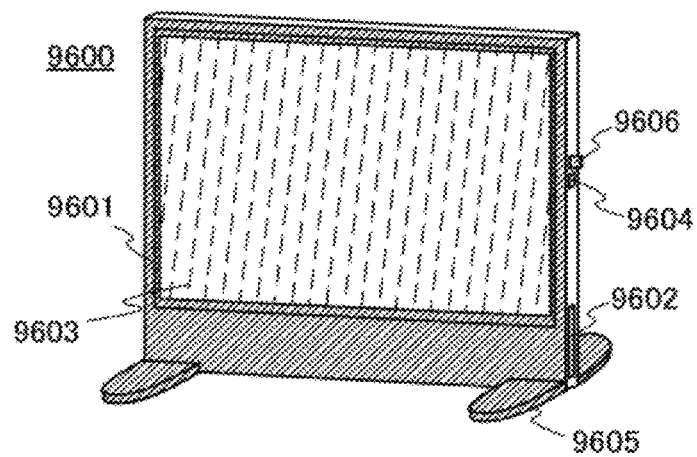

SEMICONDUCTOR DEVICE AND MANUFACTURING METHOD THEREOF

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electro-optical device, a semiconductor circuit, and an electronic device are all semiconductor devices.

2. Description of the Related Art

In recent years, a technique for forming a thin film transistor (TFT) using a semiconductor thin film (with a thickness of approximately several nanometers to several hundreds of nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications. Indium oxide is a well-known material and is used as a light-transmitting electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. Thin film transistors in each of which such a metal oxide having semiconductor characteristics is used for a channel formation region have already been known (Patent Documents 1 and 2).

REFERENCE

Patent Document

[Patent Document 1] Japanese Published Patent Application No. 2007-123861

[Patent Document 2] Japanese Published Patent Application No. 2007-96055

SUMMARY OF THE INVENTION

Electric characteristics of a transistor are easily affected by the state of an interface between an oxide semiconductor layer and an insulating film in contact with the oxide semiconductor layer. When the interface between an oxide semiconductor layer and an insulating film, that is, the interface of the oxide semiconductor layer, which is on a gate electrode side, is amorphous, electric characteristics of a transistor might be degraded while the transistor is manufactured or after the transistor is manufactured.

Thus, an object of one embodiment of the present invention is to provide a transistor in which the state of an interface between an oxide semiconductor layer and an insulating film in contact with the oxide semiconductor layer, that is, the interface of the oxide semiconductor layer, which is on a gate electrode side, is favorable; and a method for manufacturing the transistor.

Further, another object of one embodiment of the present invention is to provide a transistor with small variation in electric characteristics and a method for manufacturing the transistor.

In order to obtain a favorable state of an interface between an oxide semiconductor layer and an insulating film (gate insulating layer) in contact with the oxide semiconductor layer, nitrogen is added to a region of the oxide semiconductor layer in the vicinity of the interface with the gate insulating layer. Specifically, a concentration gradient of nitrogen is formed in the oxide semiconductor layer, and a region containing much nitrogen is provided at the interface with the gate insulating layer. By the addition of nitrogen, a region with high crystallinity can be formed in the region of the oxide semiconductor layer in the vicinity of the interface with the gate insulating layer, so that a stable interface state can be obtained.

Alternatively, the oxide semiconductor layer may have a stacked-layer structure, in which an oxide semiconductor layer containing nitrogen is provided at the interface with the gate insulating layer. In the case where the oxide semiconductor layer has the stacked-layer structure, the thickness of the oxide semiconductor layer containing nitrogen is greater than or equal to 0.1 nm and less than or equal to 10 nm, preferably greater than or equal to 1 nm and less than or equal to 5 nm.

In addition, it is preferable that much oxygen be contained in a region in the vicinity of an interface between the oxide semiconductor layer and an insulating film (protective insulating layer) in contact with the oxide semiconductor layer. Specifically, a concentration gradient of oxygen is formed in the oxide semiconductor layer, and a region containing much oxygen is provided at the interface with the protective insulating layer.

According to one embodiment of the present invention, a semiconductor device includes a gate electrode layer; a first insulating layer in contact with the gate electrode layer; an oxide semiconductor layer in contact with the first insulating layer; and a second insulating layer in contact with the oxide semiconductor layer. The oxide semiconductor layer has a concentration gradient of nitrogen, which becomes higher as closer to the first insulating layer, and has a concentration gradient of oxygen, which becomes higher as closer to the second insulating layer.

In the semiconductor device having the above structure, a region of the oxide semiconductor layer, which is in the vicinity of the interface with the first insulating layer, has higher crystallinity than other regions. Note that the oxide semiconductor layer is non-single-crystal, and the oxide semiconductor layer is not entirely in an amorphous state but includes at least a c-axis aligned crystal (also referred to as CAAC) in the oxide semiconductor layer. This crystal has c-axis alignment, and has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). In the oxide semiconductor layer, a region in the vicinity of the interface with the first insulating layer that is in contact with the gate electrode layer has a c-axis aligned wurtzite crystal structure, and a region in the vicinity of the interface with the second insulating layer includes a hexagonal second crystal which is different from the wurtzite crystal. Note that in this specification, a hexagonal crystal structure, which includes trigonal and hexagonal crystal structures classified in seven crystal systems, refers to six crystal families.

As examples of the hexagonal second crystal structure, a $YbFe_2O_4$ structure, a $Yb_2Fe_3O_7$ structure, and deformed structures of the foregoing structures can be given.

In the semiconductor device having the above structure, the nitrogen concentration of the oxide semiconductor layer in the vicinity of the interface with the first insulating layer is higher than or equal to $5 \times 10^{19}/cm^3$ and lower than or equal to 20 atomic %, preferably higher than or equal to $1 \times 10^{20}/cm^3$ and lower than 7 atomic %. Further, the nitrogen concentration of the oxide semiconductor layer in the vicinity of the interface with the second insulating layer is higher than or equal to $1 \times 10^{17}/cm^3$ and lower than $5 \times 10^{19}/cm^3$. In the oxide semiconductor layer, the energy gap of a region containing much nitrogen is smaller than the energy gap of a region containing less nitrogen; thus, carriers easily flow through the region. Thus, a structure is employed for a transistor, in which much nitrogen is contained in a region of an oxide semiconductor layer, where carriers flow, and less nitrogen is contained in a region where carriers do not flow.

There is no particular limitation on the structure of a transistor including the gate electrode layer. In a top-gate transistor, for example, a base insulating layer corresponds to the second insulating layer. In the case of a top-gate transistor, the transistor includes the oxide semiconductor layer over the second insulating layer, the first insulating layer which is a gate insulating layer over the oxide semiconductor layer, and the gate electrode layer over the first insulating layer.

In a bottom-gate transistor, a protective insulating layer corresponds to the second insulating layer. In the case of a bottom-gate transistor, the transistor includes the first insulating layer which is a gate insulating layer over the gate electrode layer, the oxide semiconductor layer over the first insulating layer, and the second insulating layer which is a protective insulating layer over the oxide semiconductor layer.

In the oxide semiconductor layer of the transistor, the crystallinity of a region containing nitrogen is higher than a region which does not contain nitrogen, interface states due to dangling bonds at the interface with the gate insulating layer are reduced, and a favorable interface state can be realized.

When the state of the interface of the oxide semiconductor layer with the insulating film in contact with the oxide semiconductor layer is made favorable, a transistor with higher electric characteristics (e.g., the field-effect mobility and the threshold value) can be obtained. The region in the vicinity of the interface with the gate insulating layer has higher crystallinity and higher uniformity than other regions; therefore, a transistor with small variation in electric characteristics can be obtained.

BRIEF DESCRIPTION OF THE DRAWINGS

FIGS. 12A to 12D illustrate embodiments of an electronic device.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

Figure 1A:
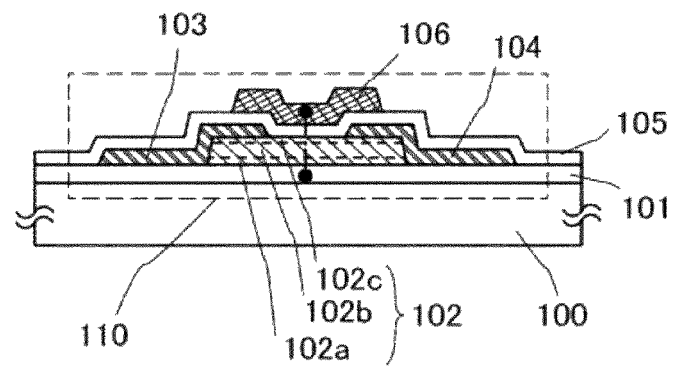
FIGS. 1A to 1D are cross-sectional views each illustrating one embodiment of the present invention.

In this embodiment, an example of a method for manufacturing a top-gate transistor which is illustrated in FIG. 1A will be described.

First, a base insulating layer 101 is formed over a substrate 100.

As the substrate 100, a substrate of a glass material such as aluminosilicate glass, aluminoborosilicate glass, or barium borosilicate glass is used. In mass production, a mother glass with the following size is preferably used for the substrate 100: the 8-th generation (2160 mm×2460 mm); the 9-th generation (2400 mm×2800 mm, or 2450 mm×3050 mm); the 10-th generation (2950 mm×3400 mm); or the like. The mother glass drastically shrinks when the treatment temperature is high and the treatment time is long. Thus, in the case where mass production is performed with use of the mother glass, the preferable heating temperature in the manufacturing process is lower than or equal to 600° C., further preferably, lower than or equal to 450° C.

The base insulating layer 101 can be formed with a single layer or a stacked layer using one or more of silicon oxide, silicon oxynitride, silicon nitride oxide, aluminum oxide, aluminum oxynitride, gallium oxide, hafnium oxide, yttrium oxide, and the like by a CVD method, a sputtering method, or the like.

Next, an oxide semiconductor layer 102 is formed over the base insulating layer 101. The oxide semiconductor layer 102 is formed using one of an AC sputtering apparatus, a DC sputtering apparatus, and an RF sputtering apparatus. As the oxide semiconductor layer 102, a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide film such as an In—Zn—O film, a Sn—Zn—O film, an Al—Zn—O film, or an In—Ga—O film can be used. Further, $SiO_2$ may be contained in the above oxide semiconductor. Here, for example, an In—Ga—Zn—O film means an oxide film containing indium (In), gallium (Ga), and zinc (Zn).

In addition, at the formation of the oxide semiconductor layer, the pressure of a treatment chamber in a sputtering apparatus is set to 0.4 Pa or less, whereby entry of an impurity such as an alkali metal or hydrogen into a film to be formed or a surface where a film is formed can be suppressed. Note that hydrogen may be contained in the film to be formed as a hydrogen molecule, water, a hydroxyl group, or hydride in some cases in addition to a hydrogen atom.

In addition, at the formation of the oxide semiconductor layer, the distance between a target and a substrate (a T-S distance) is set to greater than or equal to 40 mm and less than or equal to 300 mm (preferably, greater than or equal to 60 mm).

In addition, at the formation of the oxide semiconductor layer by a sputtering method, the temperature of the surface where a film is formed is higher than or equal to 150° C. and lower than or equal to 450° C., preferably higher than or equal to 250° C. and lower than or equal to 320° C. The temperature at which entry of an impurity such as water or hydrogen into the film to be formed is prevented and the impurity is released to a vapor phase in the chamber is 250° C. In addition, the upper limit of the temperature of the surface where a film is formed by a sputtering method is the upper limit of the heat treatment temperature for the substrate or the upper limit of the temperature of the film to be formed (if the temperature exceeds the latter upper limit, components in the film significantly change).

Moreover, when the leakage rate of the treatment chamber of the sputtering apparatus is set to less than or equal to $1 \times 10^{-10}$ Pa·m$^3$/second at the formation of the oxide semiconductor layer, entry of an impurity such as an alkali metal or hydride into the oxide semiconductor layer that is being formed by a sputtering method can be reduced. Further, with the use of an entrapment vacuum pump (e.g., a cryopump) as an evacuation system, counter flow of an impurity such as an alkali metal, a hydrogen atom, a hydrogen molecule, water, a hydroxyl group, or hydride from the evacuation system can be reduced.

Alternatively, at the formation of the oxide semiconductor layer, the film formation may be performed by introducing, for example, a nitrogen gas, an oxygen gas, an argon gas, or the like to the treatment chamber of the sputtering apparatus with the gas being heated.

Further, preheat treatment may be performed before formation of the oxide semiconductor layer, in order to remove moisture or hydrogen which remains on an inner wall of the sputtering apparatus, on a surface of the target, or inside a target material. As the preheat treatment, a method in which the inside of the deposition chamber is heated to 200° C. to 600° C. under reduced pressure, a method in which introduction and exhaust of nitrogen or an inert gas are repeated while the inside of the deposition chamber is heated, and the like can be given. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated.

The base insulating layer 101 and the oxide semiconductor layer are preferably formed in succession without exposure to the air. For example, a multi-chamber film formation apparatus is used. With the successive formation, the interface between the stacked layers can be formed without being contaminated by an atmospheric component or a contamination impurity element floating in the air.

After the oxide semiconductor layer is formed, if necessary, heat treatment may be performed in an atmosphere which hardly contains hydrogen and moisture (a nitrogen atmosphere, an oxygen atmosphere, a dry-air atmosphere (for example, as for moisture, a dew point is lower than or equal to −40° C., preferably lower than or equal to −60° C.), or the like) at a temperature higher than or equal to 150° C. and lower than or equal to 650° C., preferably higher than or equal to 200° C. and lower than or equal to 500° C. This heat treatment can be called dehydration or dehydrogenation, which is for detaching H, OH, or the like from the oxide semiconductor layer.

In this embodiment, the film formation condition is changed plural times in forming the oxide semiconductor layer 102, whereby a high oxygen concentration region 102a, an intermediate region 102b, and a high nitrogen concentration region 102c are formed.

For example, the high oxygen concentration region 102a is formed by a sputtering method using only an oxygen gas. The intermediate region 102b is formed by a sputtering method in a mixed atmosphere of an oxygen gas and a rare gas, a mixed atmosphere of oxygen and nitrogen, and an atmosphere of only a rare gas. The thickness of the intermediate region 102b is made larger than that of the high nitrogen concentration region 102c. The high nitrogen concentration region 102c is formed by a sputtering method using only a nitrogen gas. The high oxygen concentration region 102a, the intermediate region 102b, and the high nitrogen concentration region 102c can be formed by switching the kinds of gases introduced into a vacuum chamber; therefore, the nitrogen concentration and the oxygen concentration can be easily controlled and high mass productivity is realized. Note that in the case where the high nitrogen concentration region 102c is thicker than 10 nm, the high nitrogen concentration region 102c might function as a conductive region; thus, the thickness of the high nitrogen concentration region 102c is set to 10 nm or less.

Next, the oxide semiconductor layer 102 is patterned, and a source electrode layer 103 and a drain electrode layer 104 are formed. Then, a gate insulating layer 105 covering the oxide semiconductor layer 102, the source electrode layer 103, and the drain electrode layer 104 is formed. Further, a gate electrode layer 106 is formed over the gate insulating layer so as to overlap with the oxide semiconductor layer 102. In this manner, a transistor 110 can be manufactured.

The gate electrode layer 106 is formed using a metal material such as titanium, molybdenum, chromium, tantalum, tungsten, aluminum, or copper, or an alloy material thereof.

Further, as a material layer in contact with the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably provided between the gate electrode layer 106 and the gate insulating layer. These films each have a work function of 5 eV or higher, preferably 5.5 eV or higher; thus, the threshold voltage of the electric characteristics of the transistor can be positive. Accordingly, a so-called normally-off switching element can be obtained. For example, in the case of using an In—Ga—Zn—O film containing nitrogen, an In—Ga—Zn—O film having a nitrogen concentration which is higher than or equal to $1 \times 10^{20}$/cm$^3$ and lower than or equal to 20 atomic % or at least higher than that of the oxide semiconductor layer 102, e.g., 7 atomic % or higher, is used.

Figure 2A:
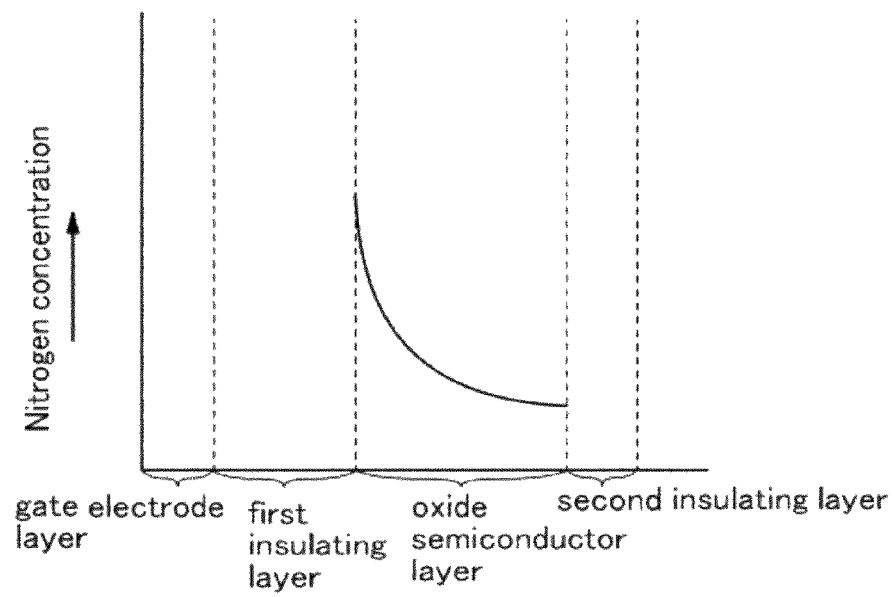
FIGS. 2A and 2B each show an example of a model graph of a concentration profile according to one embodiment of the present invention.

The film formation condition of the oxide semiconductor layer 102 is changed by continuously changing the gas flow rate, whereby a nitrogen concentration profile shown in FIG. 2A can be obtained. FIG. 2A is a schematic diagram illustrating the nitrogen concentration profile in the film thickness direction of a cross section taken along a dotted line in FIG. 1A. The nitrogen concentration profile in FIG. 2A has a concentration gradient, in which the nitrogen concentration is highest in a region on the gate insulating layer side, and continuously decreases as becomes farther from the gate insulating layer.

Figure 2B:
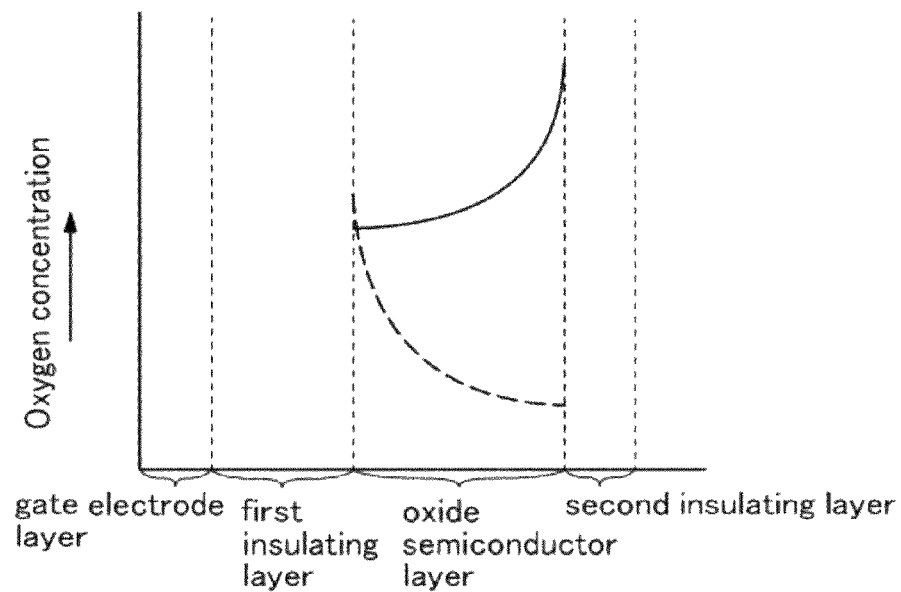

Further, the film formation condition can be adjusted as appropriate to obtain an oxygen concentration profile shown in FIG. 2B. FIG. 2B is a schematic diagram illustrating the oxygen concentration profile in the film thickness direction of a cross section taken along a dotted line in FIG. 1A. The oxygen concentration profile in FIG. 2B has a concentration gradient, in which the oxygen concentration is lowest in a region on the gate insulating layer side, and continuously increases as becomes farther from the gate insulating layer. Note that in FIG. 2B, a curve shown by a dotted line represents the nitrogen concentration. Note that in FIG. 2B, the nitrogen concentration and the oxygen concentration are each a different concentration. The nitrogen concentration profile and the oxygen concentration profile in FIG. 2B are schematic diagrams illustrating the respective relative relations, and FIG. 2B does not illustrate which of the concentrations is, for example, high or low.

Figure 3A:
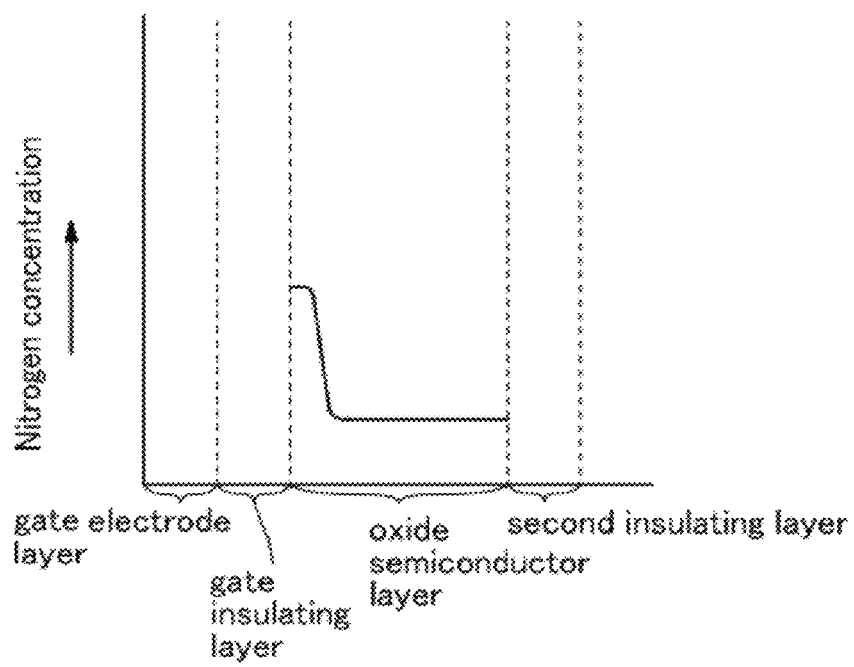
FIGS. 3A and 3B each show an example of a model graph of a concentration profile according to one embodiment of the present invention.

For example, the same target is used, and the film formation condition of the oxide semiconductor layer 102 is changed by changing the gas flow rate stepwise, whereby a nitrogen concentration profile shown in FIG. 3A can be obtained. In FIG. 3A, the first insulating layer is the gate insulating layer and the second insulating layer is the base insulating layer. In the case where the gas flow rate is changed stepwise, the nitrogen concentration profile tends to have a stepped shape. The nitrogen concentration profile in FIG. 3A has a concentration gradient, in which the nitrogen concentration is highest in a region on the gate insulating layer side, and decreases stepwise as becomes farther from the gate insulating layer. In the case where the film formation condition of the oxide semiconductor layer 102 is changed by changing the gas flow rate stepwise, the oxide semiconductor layer 102 can be regarded as a stacked layer because it includes regions having different film qualities depending on the film formation condition. Since the high nitrogen concentration region 102c has high crystallinity, the boundary with the intermediate region 102b can be observed in a TEM image or the like. On the other hand, the boundary between the high oxygen concentration region 102a and the intermediate region 102b is difficult to observe in a TEM image or the like.

Figure 3B:
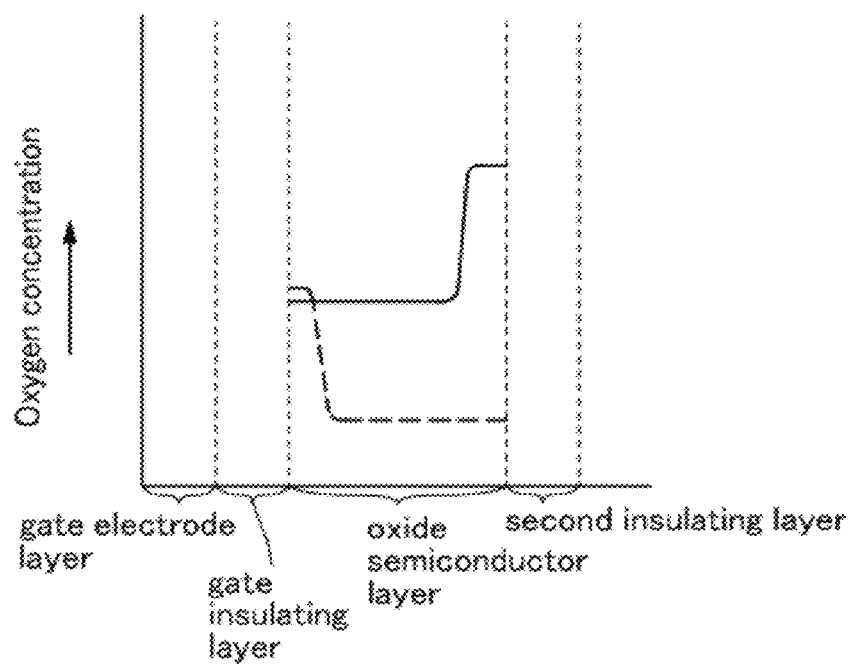

Further, the film formation condition can be adjusted as appropriate to obtain an oxygen concentration profile shown in FIG. 3B. FIG. 3B is a schematic diagram illustrating the oxygen concentration profile in the film thickness direction of a cross section taken along a dotted line in FIG. 1A. The oxygen concentration profile in FIG. 3B has a concentration gradient, in which the oxygen concentration is lowest in a region on the gate insulating layer side, and increases stepwise as becomes farther from the gate insulating layer. Note that in FIG. 3B, a curve shown by a dotted line represents the nitrogen concentration. Note that in FIG. 3B, the nitrogen concentration and the oxygen concentration are each a different concentration. The nitrogen concentration profile and the oxygen concentration profile in FIG. 3B are schematic diagrams illustrating the respective relative relations, and FIG. 3B does not illustrate which of the concentrations is, for example, high or low.

Figure 4A:
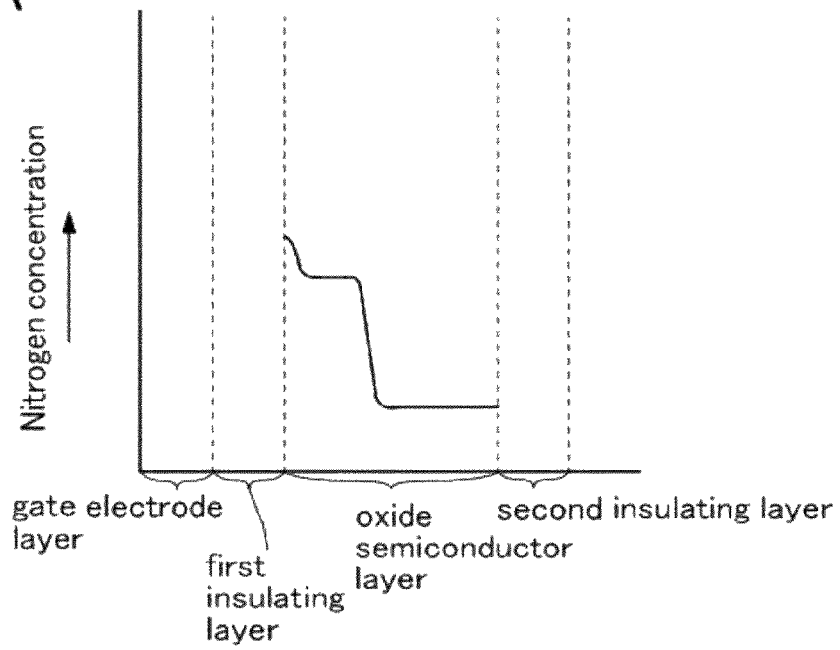
FIGS. 4A and 4B each show an example of a model graph of a nitrogen concentration profile according to one embodiment of the present invention.

The high nitrogen concentration region 102c may be formed in such a manner that a film is formed under the same condition as that of the intermediate region 102b and then nitrogen plasma treatment is performed on its surface to add nitrogen to the vicinity of the surface. In that case, a nitrogen concentration profile shown in FIG. 4A can be obtained. In the case of performing nitrogen plasma treatment, heat treatment is preferably performed under reduced pressure before the nitrogen plasma treatment. Note that the nitrogen plasma treatment may be performed in a sputtering film formation chamber in which the film has been formed under the same condition as that of the intermediate region 102b, or may be performed before formation of the gate insulating layer in a plasma CVD apparatus in which the gate insulating layer is to be formed later.

Specifically, the nitrogen concentration in the vicinity of the interface between the gate insulating layer and the oxide semiconductor layer 102, that is, the nitrogen concentration of the high nitrogen concentration region 102c, is higher than or equal to $5 \times 10^{19}/cm^3$ and lower than or equal to 20 atomic %, preferably higher than or equal to $1 \times 10^{20}/cm^3$ and lower than 7 atomic %.

Figure 4B:
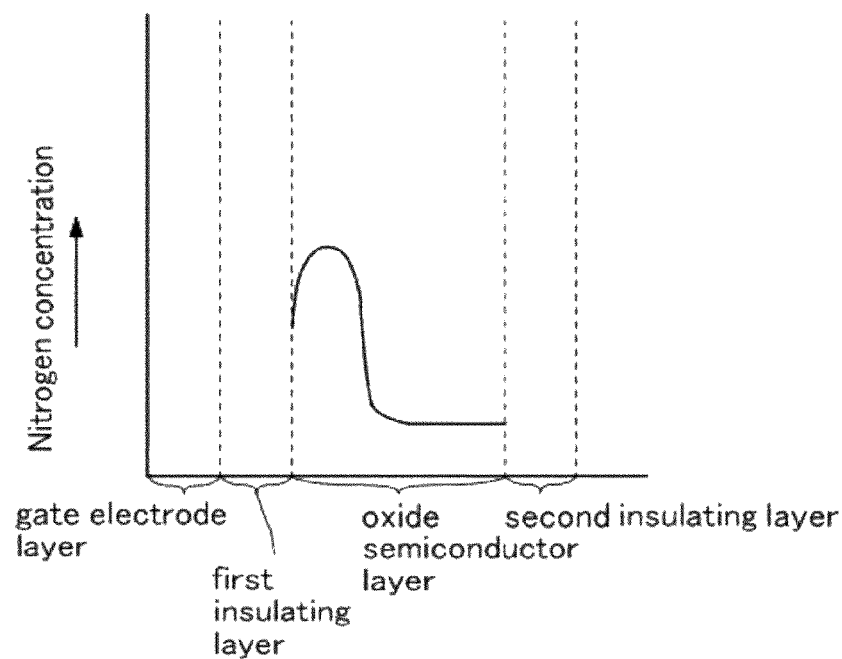

A nitrogen concentration profile shown in FIG. 4B can also be obtained without limitation of a region with the highest nitrogen concentration at the interface with the gate insulating layer. As shown in FIG. 4B, the film formation condition may be adjusted so that a region slightly away from the interface with the gate insulating layer has the highest nitrogen concentration.

Specifically, the nitrogen concentration in the vicinity of the interface between the base insulating layer and the oxide semiconductor layer 102, that is, the nitrogen concentration of the high oxygen concentration region 102a, is higher than or equal to $1 \times 10^{17}/cm^3$ and lower than $5 \times 10^{19}/cm^3$.

The transistor 110 including the oxide semiconductor layer which is formed by continuous or stepwise change of the gas flow rate of nitrogen so as to have the nitrogen concentration profile shown in FIG. 2A or FIG. 3A includes the high nitrogen concentration region 102c in the vicinity of the interface between the oxide semiconductor layer and the gate insulating layer. The high nitrogen concentration region 102c has higher crystallinity than other regions, c-axis alignment, and few interface states due to dangling bonds at the interface with the gate insulating layer, so that a favorable interface state can be realized. Therefore, the transistor 110 with higher electric characteristics (e.g., the field-effect mobility and the threshold value) can be obtained. The region in the vicinity of the interface between the oxide semiconductor layer and the gate insulating layer has higher crystallinity and higher uniformity than other regions; therefore, the transistor 110 with small variation in electric characteristics can be obtained.

A crystal included in the high nitrogen concentration region 102c has a hexagonal wurtzite crystal structure, and a crystal included in the intermediate region 102b has a hexagonal non-wurtzite crystal structure (a second crystal structure). Since both the wurtzite crystal structure and the second crystal structure are hexagonal crystal structures, a hexagonal lattice image can be observed from the c-axis direction. The intermediate region 102b can also have a wurtzite crystal structure by an increase in the nitrogen concentration thereof.

A transistor is manufactured in which a channel region is included in a crystalline oxide semiconductor film having an a-b plane where bonds for forming hexagonal lattices are formed, which is substantially parallel to the plan surface of the substrate, and c-axes which are substantially perpendicular to the plan surface of the substrate, whereby the amount of fluctuation in the threshold voltage of the transistor between before and after performance of a bias-thermal stress (BT) test or light irradiation test on the transistor can be reduced. Accordingly, a transistor with stable electric characteristics can be manufactured.

Embodiment 2

In Embodiment 1, an example of a top-gate transistor is described; in this embodiment, an example of a bottom-gate transistor illustrated in FIG. 1B will be described. Note that the same portions as those in FIG. 1A are denoted by the same reference numerals.

First, the gate electrode layer 106 is formed over the substrate 100.

The gate electrode layer 106 is formed using a metal material such as titanium, molybdenum, chromium, tantalum, tungsten, aluminum, or copper, or an alloy material thereof. The gate electrode layer 106 can be formed in such a manner that a conductive film is formed over the substrate 100 by a sputtering method or a vacuum evaporation method, a mask is formed over the conductive film by a photolithography technique or an inkjet method, and the conductive film is etched using the mask.

Further, as a material layer in contact with the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably provided between the gate electrode layer 106 and the gate insulating layer. These films each have a work function of 5 eV or higher, preferably 5.5 eV or higher; thus, the threshold voltage of the electric characteristics of the transistor can be positive. Accordingly, a so-called normally-off switching element can be obtained. For example, in the case of using an In—Ga—Zn—O film containing nitrogen, an In—Ga—Zn—O film having a nitrogen concentration higher than at least the oxide semiconductor layer 102, specifically, an In—Ga—Zn—O film having a nitrogen concentration of 7 atomic % or higher is used.

Next, the gate insulating layer 105 covering the gate electrode layer 106 is formed. The gate insulating layer 105 is preferably formed using an insulating film containing nitrogen, for example, a silicon oxynitride film (also referred to as $SiO_xN_y$ (x>y>0)) or a silicon nitride oxide film (also referred to as $SiN_xO_y$ (x>y>0)). Note that a silicon oxide film or a stack of a silicon oxide film and a silicon nitride film can also be used as the gate insulating layer 105. Alternatively, an aluminum oxide film, an aluminum oxynitride film, a gallium oxide film, a hafnium oxide film, an yttrium oxide film, or the like may be used as the gate insulating layer 105. Note that in the case of using such an insulating film and performing nitrogen plasma treatment later, the thickness or the like of the insulating film is preferably adjusted so that the insulating film sufficiently functions as a gate insulating layer.

Next, the oxide semiconductor layer 102 is formed on and in contact with the gate insulating layer 105. A region of the oxide semiconductor layer 102, which is on and in contact with the gate insulating layer 105, corresponds to the high nitrogen concentration region 102c. The intermediate region 102b is formed over the high nitrogen concentration region 102c, and the high oxygen concentration region 102a is formed thereover.

The gate insulating layer 105 and the oxide semiconductor layer 102 are preferably formed in succession without exposure to the air. For example, a multi-chamber film formation apparatus is used. With the successive formation, the interface between the stacked layers can be formed without being contaminated by an atmospheric component or a contamination impurity element floating in the air. Since the nitrogen concentration of the oxide semiconductor layer 102 and the nitrogen concentration of the gate insulating layer 105 are especially important, it is preferable to use a multi-chamber film formation apparatus so that the nitrogen concentrations of the oxide semiconductor layer 102 and the gate insulating layer 105 do not change owing to exposure to remaining nitrogen in a deposition chamber, a nitrogen atmosphere, or the like. In addition, after the gate insulating layer 105 is formed, nitrogen plasma treatment may be performed on its surface using a plasma CVD apparatus, so that nitrogen is added to the vicinity of the surface. Alternatively, before the oxide semiconductor layer 102 is formed, nitrogen plasma treatment may be performed on the surface of the gate insulating layer 105, so that nitrogen is added to the vicinity of the surface. The nitrogen plasma treatment may be performed using a sputtering apparatus.

Next, the oxide semiconductor layer 102 is patterned, and the source electrode layer 103 and the drain electrode layer 104 are formed. As a material of a metal conductive film to be the source electrode layer 103 and the drain electrode layer 104, a metal material such as Al, Cu, Cr, Ta, Ti, Mo, or W, or an alloy material containing the metal material as a component is used. In addition, a structure in which a layer of a refractory metal such as Cr, Ta, Ti, Mo, or W is stacked on a lower side and/or an upper side of a metal layer of Al, Cu, or the like may be used.

For example, the metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked, or a two-layer structure in which an aluminum layer and a molybdenum layer are stacked. Needless to say, the metal conductive film may have a single-layer structure or a stacked-layer structure including four or more layers. Note that in the case where copper is used as one of the materials of the metal conductive film, the following stack may be used: an alloy layer of copper, magnesium, and aluminum is provided in contact with the oxide semiconductor layer; and a copper layer is provided in contact with the alloy layer of copper, magnesium, and aluminum.

Next, a protective insulating layer 107 is formed so as to cover the exposed portion of the oxide semiconductor layer 102 so that the oxide semiconductor layer 102 can be protected. As the protective insulating layer 107, a structure including one or more of silicon oxide, silicon oxynitride, silicon nitride, silicon nitride oxide, aluminum oxide, aluminum oxynitride, aluminum gallium oxide, and gallium oxide can be used.

Note that the thickness of the protective insulating layer 107 is greater than or equal to 50 nm, preferably greater than or equal to 200 nm and less than or equal to 500 nm. With the protective insulating layer 107 being thick, the amount of oxygen released from the protective insulating layer 107 can be increased, and thus defects at the interface between the protective insulating layer 107 and the oxide semiconductor layer 102 can be reduced. The protective insulating layer 107 from which part of contained oxygen is released by heat treatment is easily formed by a sputtering method, which is preferable. When the protective insulating layer 107 from which part of contained oxygen is released by heat treatment is formed by a sputtering method, the amount of oxygen contained in a deposition gas is preferably large, and oxygen, a mixed gas of oxygen and a rare gas, or the like can be used.

Typically, the oxygen concentration in the deposition gas is preferably higher than or equal to 6% and lower than or equal to 100%.

If necessary, oxygen plasma treatment may be performed before the formation of the protective insulating layer 107, so that oxygen is added to the exposed portion of the oxide semiconductor layer 102.

After the protective insulating layer 107 is formed, if necessary, heat treatment may be performed in an atmosphere which hardly contains hydrogen and moisture (a nitrogen atmosphere, an oxygen atmosphere, a dry-air atmosphere (for example, as for moisture, a dew point is lower than or equal to −40° C., preferably lower than or equal to −60° C.), or the like) at a temperature higher than or equal to 150° C. and lower than or equal to 650° C., preferably higher than or equal to 200° C. and lower than or equal to 500° C.

Figure 1B:
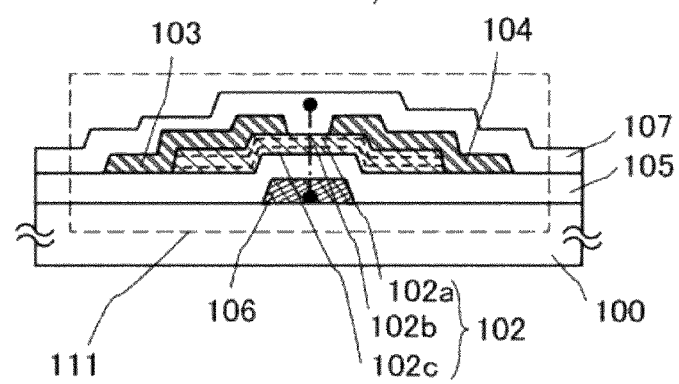

Through the above process, a transistor 111 illustrated in FIG. 1B is formed. The transistor 111 is a transistor which includes, in a channel region, a crystalline oxide semiconductor film including a crystal having a hexagonal crystal structure where c-axes are substantially perpendicular to a surface of the crystalline oxide semiconductor film.

Also in the transistor 111 illustrated in FIG. 1B, the film formation condition of the oxide semiconductor layer 102 is changed by continuously changing the gas flow rate, whereby the nitrogen concentration profile shown in FIG. 2A can be obtained. Note that the transistor 111 has a bottom-gate structure unlike the transistor in Embodiment 1, in which the oxide semiconductor layer is interposed between the gate insulating layer which is the first insulating layer and the protective insulating layer which is the second insulating layer.

Specifically, the nitrogen concentration in the vicinity of the interface between the gate insulating layer and the oxide semiconductor layer 102, that is, the nitrogen concentration of the high nitrogen concentration region 102c, is higher than or equal to $5\times10^{19}/cm^3$ and lower than or equal to 20 atomic %, preferably higher than or equal to $1\times10^{20}/cm^3$ and lower than 7 atomic %.

Further, specifically, the nitrogen concentration in the vicinity of the interface between the protective insulating layer and the oxide semiconductor layer 102, that is, the nitrogen concentration of the high oxygen concentration region 102a, is lower than $5\times10^{19}/cm^3$, preferably higher than or equal to $1\times10^{17}/cm^3$ and lower than $5\times10^{19}/cm^3$.

Further, the film formation condition can be adjusted as appropriate to obtain the oxygen concentration profile shown in FIG. 2B.

Alternatively, the film formation condition of the oxide semiconductor layer 102 is changed by changing the gas flow rate stepwise, whereby the nitrogen concentration profile shown in FIG. 3A can be obtained. Further, the film formation condition can be adjusted as appropriate to obtain the oxygen concentration profile shown in FIG. 3B.

The transistor 111 including the oxide semiconductor layer which is formed by continuous or stepwise change of the gas flow rate of nitrogen so as to have the nitrogen concentration profile shown in FIG. 2A or FIG. 3A includes the high nitrogen concentration region 102c in the vicinity of the interface between the oxide semiconductor layer and the gate insulating layer. The high nitrogen concentration region 102c has higher crystallinity than other regions, c-axis alignment, and few interface states due to dangling bonds at the interface with the gate insulating layer, so that a favorable interface state can be realized. Therefore, the transistor 111 with higher electric characteristics (e.g., the field-effect mobility and the threshold value) can be obtained. The region in the vicinity of the interface between the oxide semiconductor layer and the gate insulating layer has higher crystallinity and higher uniformity than other regions; therefore, the transistor 111 with small variation in electric characteristics can be obtained. Note that a crystal included in the high nitrogen concentration region 102c has a hexagonal wurtzite crystal structure, and a crystal included in the intermediate region 102b has a hexagonal non-wurtzite crystal structure (a second crystal structure). The intermediate region 102b can also have a wurtzite crystal structure by an increase in the nitrogen concentration thereof.

Figure 1C:
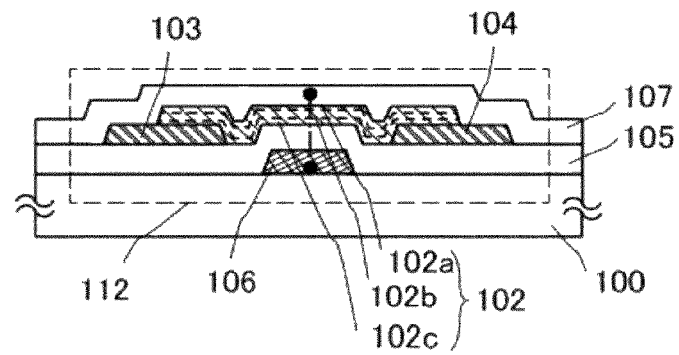
Figure 1D:
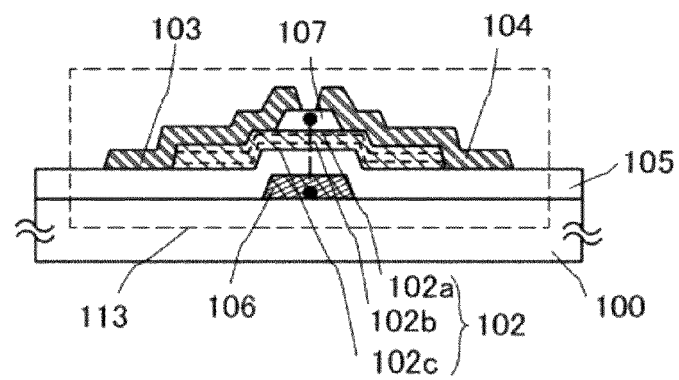

This embodiment can be applied to not only the bottom-gate transistor illustrated in FIG. 1B, but also a transistor 112 illustrated in FIG. 1C and a transistor 113 illustrated in FIG. 1D.

The structure of the transistor 112 which is illustrated in FIG. 1C is called an inverted coplanar type (also called a bottom-contact type). The transistor 112 is an example in which the order of formation of the source electrode layer 103 and the drain electrode layer 104 and formation of the oxide semiconductor layer 102 is different from that of the transistor 111, and includes the oxide semiconductor layer 102 over the source electrode layer 103 and the drain electrode layer 104.

The structure of the transistor 113 which is illustrated in FIG. 1D is called a channel stop type. The transistor 113 is an example in which the order of formation of the source electrode layer 103 and the drain electrode layer 104 and formation of the protective insulating layer 107 is different from that of the transistor 111. In the transistor 113, the protective insulating layer 107 is formed so as to overlap with the gate electrode layer 106 with the oxide semiconductor layer 102 and the gate insulating layer 105 interposed therebetween, and functions as a channel stopper.

This embodiment can be freely combined with Embodiment 1.

Embodiment 3

In this embodiment, a stack of an oxide semiconductor film including a wurtzite first crystal and an oxide semiconductor film including a hexagonal anisotropic second crystal different from the wurtzite first crystal will be described with reference to FIGS. 5A and 5B, FIGS. 6A and 6B, FIGS. 7A to 7C, FIGS. 8A and 8B, and FIGS. 9A and 9B.

Figure 5A:
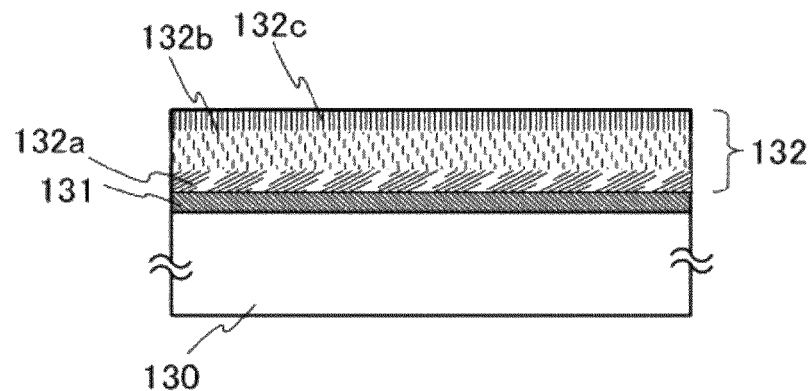
FIGS. 5A and 5B each illustrate a stacked-layer structure according to one embodiment of the present invention.
Figure 5B:
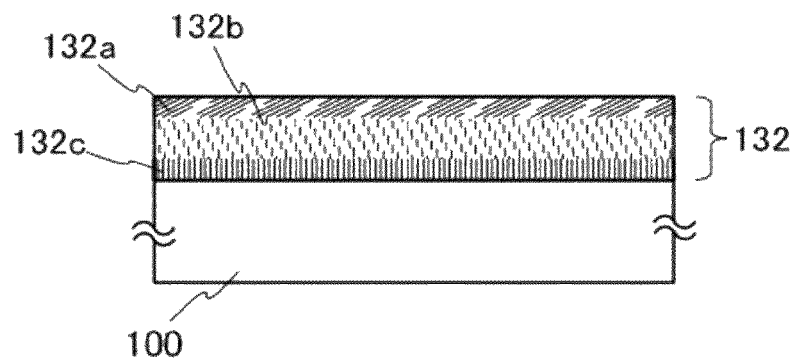

FIGS. 5A and 5B are schematic cross-sectional views each illustrating a semiconductor film including a stack of different crystal structures described as an example in this embodiment.

A semiconductor film 132 has a structure in which a high oxygen concentration region 132a, an intermediate region 132b, and a high nitrogen concentration region 132c are stacked in this order over an insulating layer 131 which is provided over a substrate 130. FIG. 5A shows the state thereof.

In FIG. 5B, the semiconductor film 132 has a structure in which the high nitrogen concentration region 132c, the intermediate region 132b, and the high oxygen concentration region 132a are stacked in this order over a substrate 100.

In both FIG. 5A and FIG. 5B, the high nitrogen concentration region 132c has higher crystallinity than the other regions: the intermediate region 132b and the high oxygen concentration region 132a.

Figure 6A:
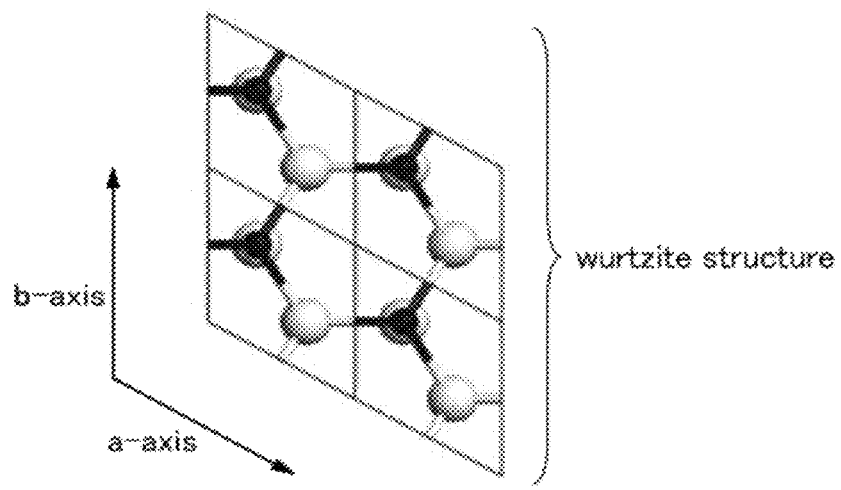
FIGS. 6A and 6B are schematic views illustrating a wurtzite crystal structure according to one embodiment of the present invention.
Figure 6B:
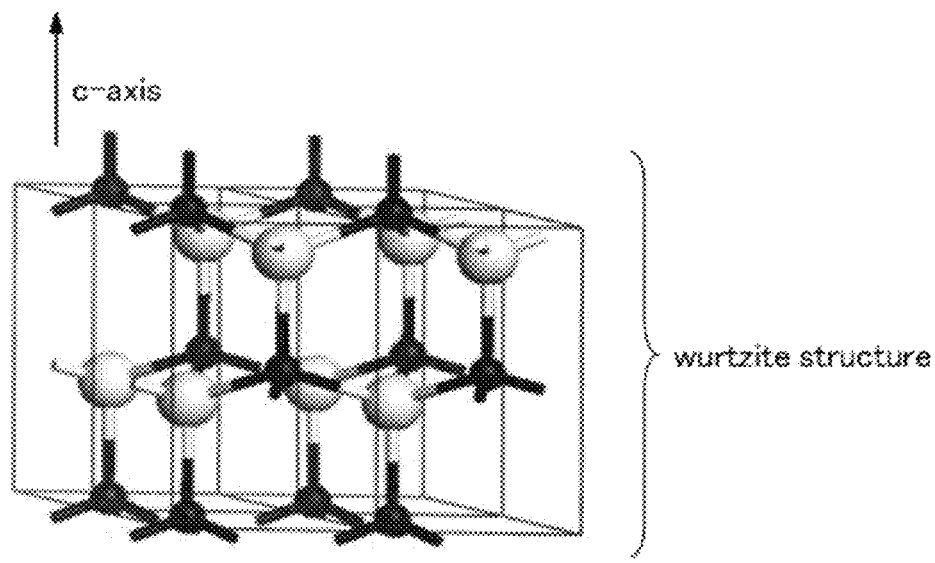

The high nitrogen concentration region 132c is c-axis aligned and has a wurtzite crystal structure. The wurtzite crystal structure will be described with reference to FIGS. 6A and 6B. As for the wurtzite crystal structure, FIG. 6A illustrates distribution of atoms in the a-b plane, and FIG. 6B illustrates a structure where the c-axis direction is the vertical direction.

Indium nitride and gallium nitride can be given as examples of a material whose crystal has the wurtzite crystal structure. Further, an oxide semiconductor containing nitrogen can be a film including the wurtzite crystal in some cases.

Specifically, an In—Ga—Zn—O film containing nitrogen at a concentration higher than or equal to $5\times10^{19}/cm^3$, preferably higher than or equal to $1\times10^{20}/cm^3$ and lower than 7 atomic %, becomes a film which is c-axis aligned and which includes the wurtzite crystal; and In, Ga, and Zn are included at random in a metal site.

On the other hand, each of the intermediate region 132b and the high oxygen concentration region 132a is c-axis aligned and has a hexagonal second crystal structure.

For example, an In—Ga—Zn—O film containing nitrogen at a concentration higher than or equal to $1\times10^{17}/cm^3$ and lower than or equal to $5\times10^{19}/cm^3$ becomes a film which is c-axis aligned and which includes the hexagonal second crystal. The In—Ga—Zn—O film including the hexagonal second crystal has an In—O crystal plane (a crystal plane containing indium and oxygen) in the a-b plane and two layers containing Ga and Zn between In—O crystal planes. Note that as for the two layers containing Ga and Zn, there is no limitation on the position of Ga and Zn as long as at least one of Ga and Zn is contained in each of the layers.

The wurtzite crystal structure and the hexagonal second crystal structure are both hexagonal crystal structures, in which atoms are arranged in a hexagonal shape in the a-b plane. Further, the hexagonal second crystal is in contact with the wurtzite crystal, and the hexagonal second crystal is aligned with the wurtzite crystal.

Figure 7A:
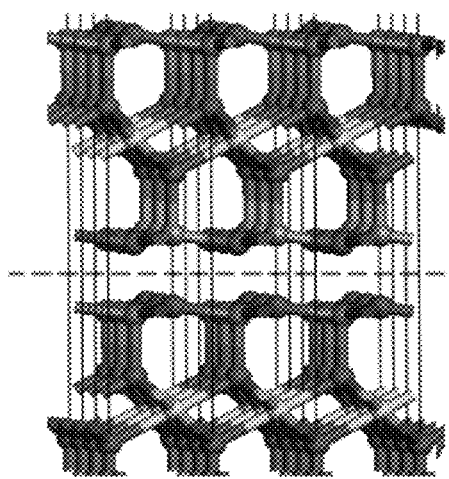
FIGS. 7A to 7C are schematic views illustrating an interface between different crystal structures according to one embodiment of the present invention.
Figure 7C:
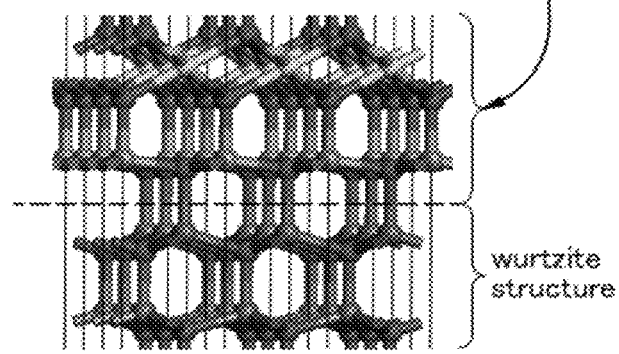
Figure 7B:
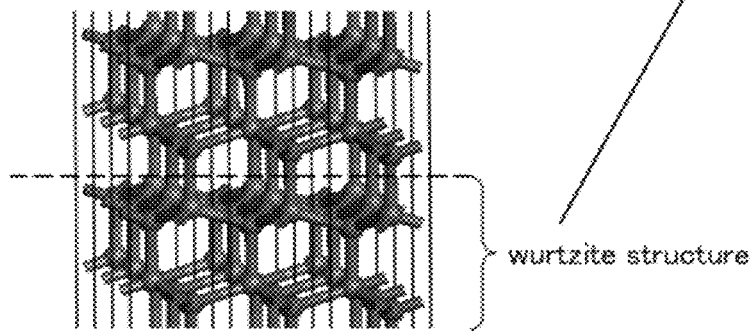

FIGS. 7A to 7C illustrate a manner in which the hexagonal second crystal is aligned on the wurtzite crystal structure having the same lattice constant. FIG. 7A illustrates the hexagonal second crystal structure, and FIG. 7B illustrates the wurtzite crystal structure. In addition, FIG. 7C is a schematic view illustrating a manner in which the hexagonal second crystal is in contact with the wurtzite crystal and the hexagonal second crystal is aligned with the wurtzite crystal. Note that this stacked-layer structure corresponds to that in FIG. 5B.

Thus, the high nitrogen concentration region 132c including the wurtzite crystal which has high crystallinity and is easily crystallized is formed, and the intermediate region 132b is formed in contact with the high nitrogen concentration region 132c, whereby an advantageous effect that the wurtzite crystal included in the high nitrogen concentration region 132c facilitates crystallization of the intermediate region 132b is obtained.

Next, the high nitrogen concentration region 132c is described. The high nitrogen concentration region 132c is c-axis aligned and includes the wurtzite crystal. In particular, the high nitrogen concentration region 132c is formed using a material that has high crystallinity and is easily crystallized as compared to other regions.

The wurtzite crystal included in the high nitrogen concentration region 132c is described.

Indium nitride and gallium nitride can be given as examples of a material whose crystal has the wurtzite crystal structure. An oxide semiconductor containing nitrogen at a concentration higher than or equal to $5\times10^{19}/cm^3$, preferably higher than or equal to $1\times10^{20}/cm^3$ and lower than 7 atomic %, can be a film including the wurtzite crystal in some cases.

Note that a diffraction image where bright points appear alternately may be observed in an observation image of the wurtzite crystal structure, which is obtained using a high-angle annular dark field (HAADF)-STEM.

Figure 8A:
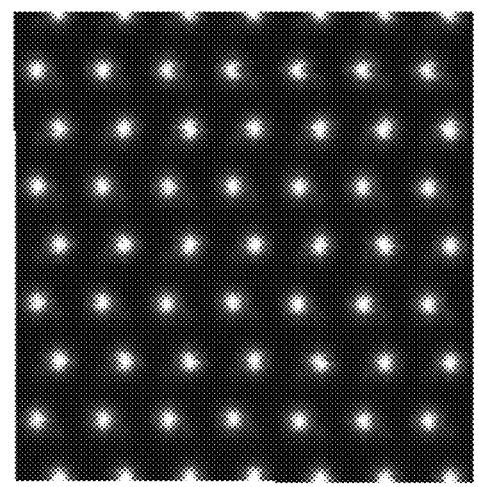
FIGS. 8A and 8B are real observation images of HAADF-STEM of a crystal structure according to Embodiment.

FIG. 8A shows a HAADF-STEM image obtained by calculation based on the wurtzite crystal structure.

Figure 8B:
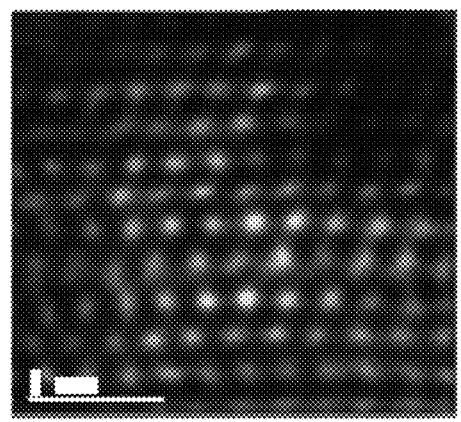

FIG. 8B shows a HAADF-STEM observation image of an In—Ga—Zn—O film formed using a deposition gas containing only nitrogen.

From each of the HAADF-STEM image in FIG. 8A and the HAADF-STEM observation image in FIG. 8B, it can be confirmed that the wurtzite crystal structure has a two-cycle layer structure.

The In—Ga—Zn—O film containing nitrogen was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only nitrogen was introduced as a sputtering gas into a deposition chamber at a flow rate of 40 sccm.

Next, the intermediate region 132b and the high oxygen concentration region 132a are described. Each of the intermediate region 132b and the high oxygen concentration region 132a is at least c-axis aligned and includes the hexagonal second crystal.

Next, the hexagonal anisotropic second crystal will be described.

As examples of the hexagonal second crystal (non-wurtzite crystal) structure, a $YbFe_2O_4$ structure, a $Yb_2Fe_3O_7$ structure, and deformed structures of the foregoing structures can be given. For example, In—Ga—Zn—O that is a three-component metal oxide has the hexagonal second crystal structure and can be used for the intermediate region 132b and the high oxygen concentration region 132a. Note that the In—Ga—Zn—O film which can be used for the intermediate region 132b and the high oxygen concentration region 132a may contain nitrogen at a concentration higher than or equal to $1\times10^{17}/cm^3$ and lower than or equal to $5\times10^{19}/cm^3$.

Examples of In—Ga—Zn—O that is a three-component metal oxide include $InGaZnO_4$ having a $YbFe_2O_4$ structure and $In_2Ga_2ZnO_7$ having a $Yb_2Fe_3O_7$ structure, and the In—Ga—Zn—O can have any of deformed structures of the foregoing structures (M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315). Note that a layer containing Yb is denoted by an A layer and a layer containing Fe is denoted by a B layer, below. The $YbFe_2O_4$-type structure has a repeated structure of ABB|ABB|ABB. As an example of a deformed structure of the $YbFe_2O_4$-type structure, a repeated structure of ABBB|ABBB can be given. Further, the $Yb_2Fe_3O_7$-type structure has a repeated structure of ABB|AB|ABB|AB. As an example of a deformed structure of the $Yb_2Fe_3O_7$-type structure, a repeated structure of ABBB|ABB|ABBB|ABB|ABBB|ABB| can be given.

Further, for the intermediate region 132b and the high oxygen concentration region 132a, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide such as an In—Zn—O film, a Sn—Zn—O film, an Al—Zn—O film, or an In—Ga—O film; or the like can be used. In this specification, for example, an In—Ga—Zn—O film means an oxide film containing indium (In), gallium (Ga), and zinc (Zn).

Note that a diffraction image where one layer with bright points appears in every third layer may be observed in an observation image of the hexagonal second crystal structure, which is obtained using a high-angle annular dark field (HAADF)-STEM.

Figure 9A:
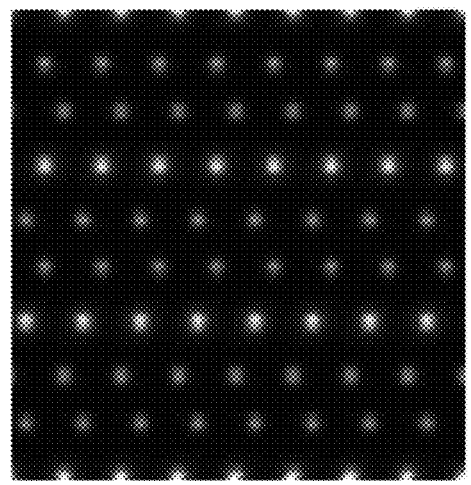
FIGS. 9A and 9B are real observation images of HAADF-STEM of a crystal structure according to Embodiment.

FIG. 9A shows a HAADF-STEM image obtained by calculation based on the hexagonal second crystal structure.

Figure 9B:
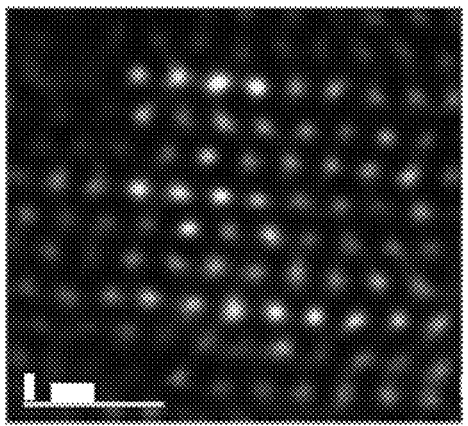

FIG. 9B shows a HAADF-STEM observation image of an In—Ga—Zn—O film.

From each of the HAADF-STEM image in FIG. 9A and the HAADF-STEM observation image in FIG. 9B, it can be confirmed that one layer with bright points appears in every third layer and that the hexagonal second crystal structure has a nine-cycle layer structure.

Note that the In—Ga—Zn—O film was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only oxygen was introduced as a sputtering gas into a deposition chamber at a flow rate of 40 sccm.

This embodiment can be freely combined with any of the other embodiments in this specification.

Embodiment 4

In this embodiment, an example of manufacturing a display device in which at least part of a driver circuit and a transistor to be disposed in a pixel portion are formed over the same substrate will be described below.

The transistor to be disposed in the pixel portion is formed according to Embodiment 1 or 2. Further, the transistor described in Embodiment 1 or 2 is an n-channel transistor, and thus part of a driver circuit that can be formed with n-channel transistors among driver circuits is formed over the same substrate as the transistor of the pixel portion.

Figure 10A:
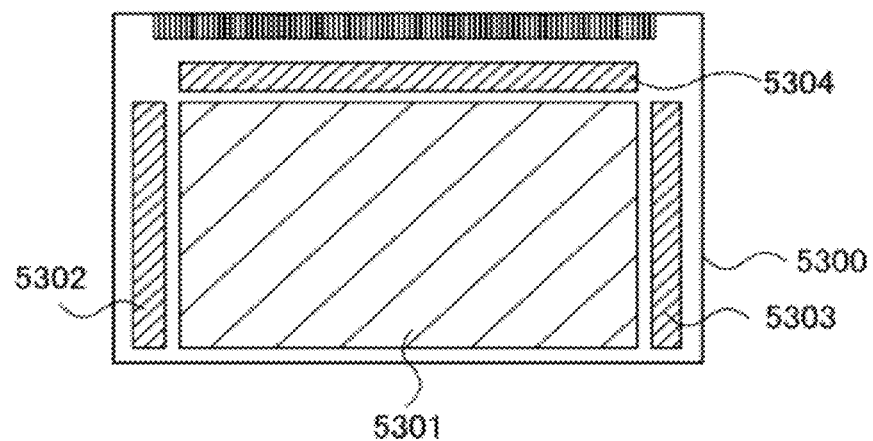
FIGS. 10A to 10C are a block diagram and equivalent circuit diagrams illustrating one embodiment of the present invention.

FIG. 10A is an example of a block diagram of an active matrix display device. A pixel portion 5301, a first scan line driver circuit 5302, a second scan line driver circuit 5303, and a signal line driver circuit 5304 are formed over a substrate 5300 of the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection point such as a flexible printed circuit (FPC).

In FIG. 10A, the first scan line driver circuit 5302, the second scan line driver circuit 5303, and the signal line driver circuit 5304 are formed over the same substrate 5300 as the pixel portion 5301. Accordingly, the number of components such as a driver circuit which are provided outside are reduced, so that reduction in cost can be achieved. Further, if the driver circuit is provided outside the substrate 5300, wirings would need to be extended and the number of wiring connections would be increased, but if the driver circuit is provided over the substrate 5300, the number of wiring connections can be reduced. Consequently, improvement in reliability and yield can be achieved.

Figure 10B:
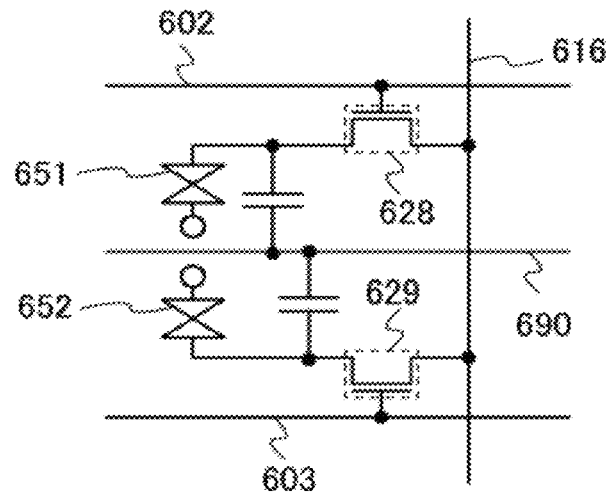

FIG. 10B illustrates an example of a circuit configuration of the pixel portion. Here, a pixel structure of a VA liquid crystal display panel is described.

In this pixel structure, a plurality of pixel electrode layers are provided in one pixel, and transistors are connected to respective pixel electrode layers. The transistors are driven by different gate signals. In other words, signals applied to individual pixel electrode layers in a multi-domain pixel are controlled independently.

A gate wiring 602 of a transistor 628 and a gate wiring 603 of a transistor 629 are separated so that different gate signals can be given thereto. In contrast, a source or drain electrode layer 616 functioning as a data line is shared by the transistors 628 and 629. As each of the transistors 628 and 629, any of the transistors described in Embodiments 1 and 2 can be used as appropriate.

A first pixel electrode layer and a second pixel electrode layer have different shapes and are separated by a slit. The second pixel electrode layer is provided so as to surround the external side of the first pixel electrode layer which is spread in a V shape. Timing of voltage application is made to vary between the first and second pixel electrode layers by the transistors 628 and 629 in order to control alignment of the liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can be varied.

Further, a storage capacitor is formed using a capacitor wiring 690, a gate insulating layer as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 651. The second pixel electrode layer, a liquid crystal layer, and a counter electrode layer overlap with each other to form a second liquid crystal element 652. The pixel structure is a multi-domain structure in which the first liquid crystal element 651 and the second liquid crystal element 652 are provided in one pixel.

Note that the pixel structure is not limited to that illustrated in FIG. 10B. For example, a switch, a resistor, a capacitor, a transistor, a sensor, a logic circuit, or the like may be added to the pixel illustrated in FIG. 10B. Further, a light-blocking layer is provided to prevent an oxide semiconductor layer of the transistor from being irradiated with light such as light from a backlight or external light. The light-blocking layer may be provided between the pixel electrode layer and the oxide semiconductor layer, or an optical film (e.g., a color filter) including a light-blocking layer may be attached to the substrate.

In this embodiment, an example of the VA liquid crystal display panel is shown; however, it is not particularly limited, and the present invention can be applied to various modes of liquid crystal display devices. For example, as a method for improving viewing angle characteristics, the present invention can be applied to a lateral electric field method (also referred to as IPS) in which an electric field in the horizontal direction to the main surface of the substrate is applied to the liquid crystal layer.

For example, it is preferable to use liquid crystal exhibiting a blue phase for which an alignment film is not necessary for an IPS liquid crystal display panel. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer of the liquid crystal element in order to improve the temperature range. The liquid crystal composition which includes a liquid crystal exhibiting a blue phase and a chiral agent has a short response time of 1 msec or less, and has optical isotropy, which makes the alignment process unneeded and viewing angle dependence small.

Further, in order to improve moving-image characteristics of a liquid crystal display device, a driving technique (e.g., a field sequential method) may be employed, in which a plurality of light-emitting diodes (LEDs) or a plurality of EL light sources is used as a backlight to form a surface light source, and each light source of the surface light source is independently driven in a pulsed manner in one frame period. As the surface light source, three or more kinds of LEDs may be used or an LED emitting white light may be used. In the case where three or more kinds of light sources emitting different colors (e.g., light sources of red (R), green (G), and blue (B)) are used as the surface light source, color display can be performed without a color filter. Further, in the case where an LED emitting white light is used as the surface light source, color display is performed with a color filter. Since a plurality of LEDs can be controlled independently, the light emission timing of LEDs can be synchronized with the timing at which a liquid crystal layer is optically modulated. Part of the LEDs can be turned off; therefore, an advantageous effect of reducing power consumption can be obtained particularly in the case where an image having a large black part is displayed.

Figure 10C:
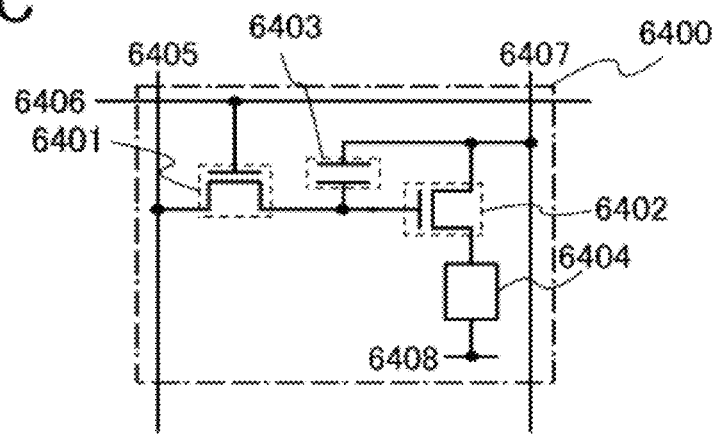

FIG. 10C shows an example of a circuit configuration of the pixel portion. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 10C illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driving transistor 6402, a light-emitting element 6404, and a capacitor 6403. A gate electrode layer of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate electrode layer of the driving transistor 6402. The gate electrode layer of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential that is lower than a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to a forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel formation region and the gate electrode layer.

In the case of a voltage-input voltage driving method, a video signal is input to the gate electrode layer of the driving transistor 6402 so that the driving transistor 6402 is in either of two states of being sufficiently turned on and turned off. That is, the driving transistor 6402 operates in a linear region, and thus, voltage higher than the voltage of the power supply line 6407 is applied to the gate electrode layer of the driving transistor 6402. Note that a voltage higher than or equal to (voltage of the power supply line+Vth of the driving transistor 6402) is applied to the signal line 6405.

In the case of performing analog grayscale driving instead of digital time grayscale driving, the same pixel structure as in FIG. 10C can be employed by inputting signals in a different way.

In the case of performing analog grayscale driving, a voltage higher than or equal to the sum of the forward voltage of the light-emitting element 6404 and Vth of the driving transistor 6402 is applied to the gate electrode layer of the driving transistor 6402. The forward voltage of the light-emitting element 6404 indicates a voltage at which a desired luminance is obtained, and includes at least forward threshold voltage. The video signal by which the driving transistor 6402 operates in a saturation region is input, so that current can be supplied to the light-emitting element 6404. In order for the driving transistor 6402 to operate in the saturation region, the potential of the power supply line 6407 is set higher than the gate potential of the driving transistor 6402. When an analog video signal is used, it is possible to feed current to the light-emitting element 6404 in accordance with the video signal and perform analog grayscale driving.

Note that the pixel structure is not limited to that illustrated in FIG. 10C. For example, a switch, a resistor, a capacitor, a sensor, a transistor, a logic circuit, or the like may be added to the pixel illustrated in FIG. 10C.

Figure 11A:
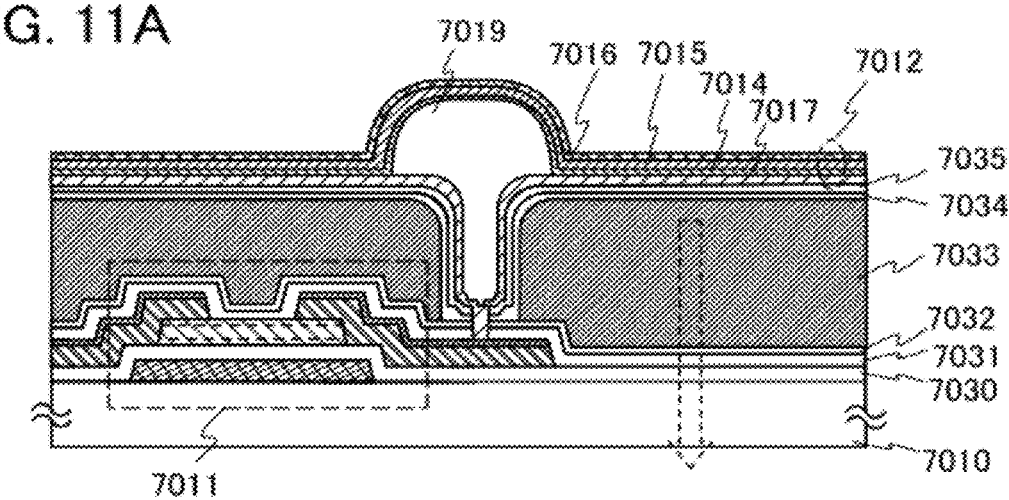
FIGS. 11A to 11C are cross-sectional views each illustrating one embodiment of the present invention.
Figure 11B:
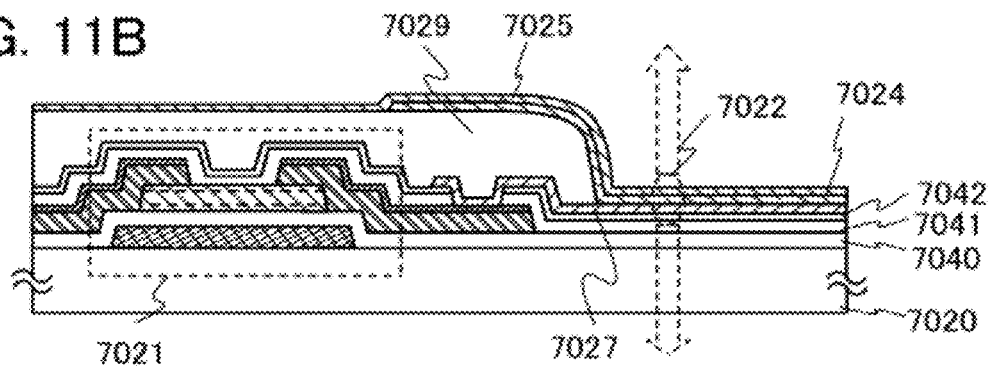
Figure 11C:
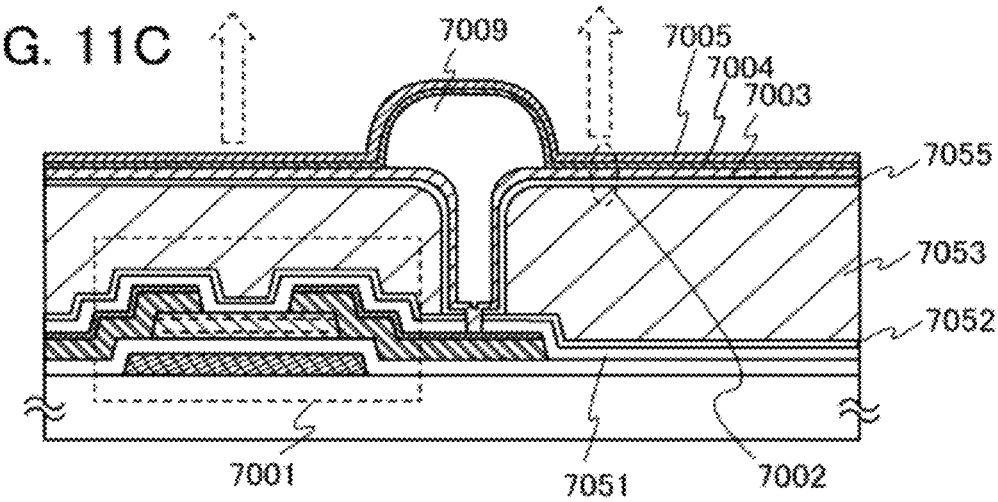

Next, structures of a light-emitting element will be described with reference to cross-sectional structures of a pixel, which are illustrated in FIGS. 11A to 11C. Here, cross-sectional structures of a pixel will be described by taking the case where a transistor for driving a light-emitting element is an n-channel transistor as an example. A transistor 7011 for driving a light-emitting element, a transistor 7021 for driving a light-emitting element, and a transistor 7001 for driving a light-emitting element which are used for semiconductor devices illustrated in FIGS. 11A, 11B, and 11C, respectively, can be manufactured in a manner similar to that of the transistor described in Embodiment 1 or 2, and in each of these transistors, nitrogen is contained at a high concentration at an interface between a gate insulating layer and an oxide semiconductor layer.

At least one of a first electrode and a second electrode of the light-emitting element is formed using a conductive film which transmits visible light, and light emission is extracted from the light-emitting element. When attention is focused on the direction from which light emission is extracted, the following structures can be given: a top emission structure in which light emission is extracted from the side of a substrate on which a light-emitting element is formed without passing through the substrate over which the light-emitting element and a transistor are formed; a bottom emission structure in which light emission is extracted from the side where the light-emitting element is not formed through the substrate over which the light-emitting element is formed; and a dual emission structure in which light emission is extracted from both the side of the substrate on which the light-emitting element is formed and the other side of the substrate through the substrate. The pixel structure illustrated in FIG. 10C can be applied to a light-emitting element having any of these emission structures.

A light-emitting element having a bottom emission structure is described with reference to FIG. 11A. The light-emitting element having a bottom emission structure emits light in a direction indicated by an arrow in FIG. 11A.

In FIG. 11A, an example in which the transistor 111 described in Embodiment 2 is used as the transistor 7011 for driving a light-emitting element is shown; however, there is no particular limitation.

In FIG. 11A, over a first electrode 7017 having a light-transmitting property which is electrically connected to a source electrode or a drain electrode of the transistor 7011 for driving a light-emitting element, an EL layer 7014 and a second electrode 7015 are stacked in this order.

The first electrode 7017 is formed using a conductive film which transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness enough to transmit light (preferably, approximately 5 nm to 30 nm) can also be used. For example, an aluminum film with a thickness of 20 nm can be stacked over another conductive film having a light-transmitting property.

As for the second electrode 7015, a material which efficiently reflects light emitted from the EL layer 7014 is preferably used, in which case the light extraction efficiency can be improved. Note that the second electrode 7015 may have a stacked-layer structure. For example, a conductive film which transmits visible light, which is formed on the side which is in contact with the EL layer 7014, may be stacked over a light-blocking film. As the light-blocking film, although a metal film or the like which efficiently reflects light emitted from the EL layer is preferable, for example, a resin or the like to which a black pigment is added can also be used.

Note that one of the first electrode 7017 and the second electrode 7015 functions as an anode, and the other functions as a cathode. It is preferable to use a substance having a high work function for the electrode which functions as an anode, and a substance having a low work function for the electrode which functions as a cathode.

As a material having a high work function, for example, ZrN, Ti, W, Ni, Pt, Cr, ITO, or IZO (registered trademark) can be used. As a material having a low work function, for example, an alkali metal such as Li or Cs, an alkaline earth metal such as Mg, Ca, or Sr, an alloy including any of these (such as Mg:Ag or Al:Li), a rare earth metal such as Yb or Er, or the like can be used.

Note that when power consumption is compared, it is preferable that the first electrode 7017 serve as a cathode and the second electrode 7015 serve as an anode because an increase in voltage of a driver circuit portion can be suppressed and power consumption can be reduced.

The EL layer 7014 includes at least a light-emitting layer and may be either a single layer or a stack of plural layers. As the structure in which a plurality of layers is stacked, a structure in which an anode, a hole injection layer, a hole transport layer, a light-emitting layer, an electron transport layer, and an electron injection layer are stacked in this order can be given as an example. Note that unlike the light-emitting layer, not all of these layers except the light-emitting layer are necessarily provided in the EL layer 7014. Further, each of these layers may be provided in duplicate or more. Specifically, in the EL layer 7014, a plurality of light-emitting layers may be overlapped with each other or another hole injection layer may overlap the electron injection layer. Furthermore, another component such as an electron-relay layer may be added as appropriate as an intermediate layer, in addition to the charge generation layer.

A light-emitting element 7012 is provided with a partition wall 7019 which covers an edge of the first electrode 7017. As the partition wall 7019, an inorganic insulating film or an organic polysiloxane film can be applied in addition to an organic resin film of polyimide, acrylic, polyamide, epoxy, or the like. It is particularly preferable that the partition wall 7019 be formed using a photosensitive resin material so that a side surface of the partition wall 7019 be formed as a tilted surface with a continuous curvature. In the case where a photosensitive resin material is used for the partition wall 7019, a step of forming a resist mask can be omitted. Further, the partition wall can be formed using an inorganic insulating film. When the inorganic insulating film is used for the partition wall, the amount of moisture contained in the partition wall can be reduced.

Note that a color filter layer 7033 is provided between the light-emitting element 7012 and a substrate 7010 (see FIG. 11A). A structure for emitting white light is employed for the light-emitting element 7012, whereby light emitted from the light-emitting element 7012 passes through the color filter layer 7033 and then passes through a second gate insulating layer 7031, a first gate insulating layer 7030, and the substrate 7010 so as to be emitted to the outside.

Plural kinds of the color filter layer 7033 may be formed. For example, a red color filter layer, a blue color filter layer, a green color filter layer, or the like can be provided in each pixel. Note that the color filter layer 7033 is formed by a droplet discharge method such as an ink jet method, a printing method, an etching method using a photolithography technique, or the like.

The color filter layer 7033 is covered with an overcoat layer 7034 and the protective insulating layer 7035 is further formed thereover. Note that although the overcoat layer 7034 with a small thickness is illustrated in FIG. 11A, the overcoat layer 7034 is formed using a resin material such as an acrylic resin and has a function of planarizing roughness due to the color filter layer 7033.

A contact hole which is formed in the second gate insulating layer 7031, an insulating layer 7032, the color filter layer 7033, the overcoat layer 7034, and the protective insulating layer 7035 and which reaches the drain electrode layer is in a position which overlaps with the partition wall 7019.

Next, a light-emitting element having a dual emission structure is described with reference to FIG. 11B. The light-emitting element having a dual emission structure emits light in directions indicated by arrows in FIG. 11B.

In FIG. 11B, an example in which the transistor 111 described in Embodiment 2 is used as the transistor 7021 for driving a light-emitting element is shown; however, there is no particular limitation.

In FIG. 11B, over a first electrode 7027 having a light-transmitting property which is electrically connected to a source electrode or a drain electrode of the transistor 7021 for driving a light-emitting element, an EL layer 7024 and a second electrode 7025 are stacked in this order.

The first electrode 7027 and the second electrode 7025 are each formed using a conductive film which transmits visible light. The material which can be used for the first electrode 7017 in FIG. 11A can be used for the conductive film which transmits visible light. Thus, the description of the first electrode 7017 is referred to for the details.

Note that one of the first electrode 7027 and the second electrode 7025 functions as an anode, and the other functions as a cathode. It is preferable to use a substance having a high work function for the electrode which functions as an anode, and a substance having a low work function for the electrode which functions as a cathode.

The EL layer 7024 may be either a single layer or a stack of plural layers. As for the EL layer 7024, the structure and material which can be used for the EL layer 7014 in FIG. 11A can be used. Thus, the description of the EL layer 7014 is referred to for the details.

A light-emitting element 7022 is provided with a partition wall 7029 which covers an edge of the first electrode 7027. As for the partition wall 7029, the structure and material which can be used for the partition wall 7019 in FIG. 11A can be used. Thus, the description of the partition wall 7019 is referred to for the details.

In addition, in the element structure illustrated in FIG. 11B, light is emitted from the light-emitting element 7022 to both the second electrode 7025 side and the first electrode 7027 side as indicated by arrows, and light emitted to the first electrode 7027 side passes through a second gate insulating layer 7041, an insulating layer 7042, a first gate insulating layer 7040, and a substrate 7020 so as to be emitted to the outside.

In the structure of FIG. 11B, when full color display is performed, for example, the light-emitting element 7022 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

Next, a light-emitting element having a top emission structure is described with reference to FIG. 11C. The light-emitting element having a top emission structure emits light in a direction indicated by arrows in FIG. 11C.

In FIG. 11C, an example in which the transistor 111 described in Embodiment 2 is used as the transistor 7001 for driving a light-emitting element is shown; however, there is no particular limitation.

In FIG. 11C, over a first electrode 7003 which is electrically connected to a source electrode or a drain electrode of the transistor 7001 for driving a light-emitting element, an EL layer 7004 and a second electrode 7005 are stacked in this order.

As for the first electrode 7003, a material which efficiently reflects light emitted from the EL layer 7004 is preferably used, in which case the light extraction efficiency can be improved. Note that the first electrode 7003 may have a stacked-layer structure. For example, a conductive film which transmits visible light, which is formed on the side in contact with the EL layer 7004, may be stacked over a light-blocking film. As the light-blocking film, although a metal film or the like which efficiently reflects light emitted from the EL layer is preferable, a resin or the like to which a black pigment is added can also be used, for example.

The second electrode 7005 is formed using a conductive film which transmits visible light. The material which can be used for the first electrode 7017 of FIG. 11A can be used for the conductive film which transmits visible light. Thus, the description of the first electrode 7017 is referred to for the details.

Note that one of the first electrode 7003 and the second electrode 7005 functions as an anode, and the other functions as a cathode. It is preferable to use a substance having a high work function for the electrode which functions as an anode, and a substance having a low work function for the electrode which functions as a cathode.

The EL layer 7004 may be either a single layer or a stack of plural layers. As for the EL layer 7004, the structure and material which can be used for the EL layer 7014 in FIG. 11A can be used. Thus, the description of the EL layer 7014 is referred to for the details.

A light-emitting element 7002 is provided with a partition wall 7009 which covers an edge of the first electrode 7003. As for the partition wall 7009, the structure and material which can be used for the partition wall 7019 in FIG. 11A can be used. Thus, the description of the partition wall 7019 is referred to for the details.

In FIG. 11C, the source electrode or the drain electrode of the transistor 7001 for driving a light-emitting element is electrically connected to the first electrode 7003 through a contact hole provided in a protective insulating layer 7052 and an insulating layer 7055. A planarizing insulating layer 7053 can be formed using a resin material such as polyimide, acrylic, benzocyclobutene, polyamide, or epoxy. Other than such resin materials, a low-dielectric constant material (a low-k material), a siloxane-based resin, or the like can be used. Note that the planarizing insulating layer 7053 may be formed by stacking a plurality of insulating films formed using any of these materials. There is no particular limitation on the method for forming the planarization insulating layer 7053, and the planarization insulating layer 7053 can be formed, depending on the material, by a sputtering method, an SOG method, spin coating, dip coating, spray coating, a droplet discharge method (such as an inkjet method, screen printing, or offset printing), or the like.

In the structure of FIG. 11C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

In the structure of FIG. 11C, a light-emitting display device capable of full color display may be manufactured in such a manner that all of a plurality of light-emitting elements which is arranged is white light-emitting elements and a sealing substrate having a color filter or the like is arranged over the light-emitting element 7002. When a material which exhibits monochromatic light such as white light is formed and combined with color filters or color conversion layers, full-color display can be performed.

Needless to say, display of monochromatic light can also be performed. For example, a lighting device may be formed with the use of white light emission, or an area-color light-emitting device may be formed with the use of a single color light emission.

If necessary, an optical film such as a polarizing film including a circularly polarizing plate may be provided.

Note that the example is described in which a transistor which controls the driving of a light-emitting element (a transistor for driving a light-emitting element) is electrically connected to the light-emitting element; however, a structure may be employed in which a transistor for current control is connected between the transistor for driving a light-emitting element and the light-emitting element.

Note that the structure of the semiconductor device described in this embodiment is not limited to those illustrated in FIGS. 11A to 11C and can be modified in various ways based on techniques of the present invention.

Embodiment 5

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the display device described in the above embodiment will be described.

FIG. 12A illustrates a portable information terminal, which includes s main body 3001, a housing 3002, display portions 3003a and 3003b, and the like. The display portion 3003b is a panel having a touch-input function. By touching keyboard buttons 3004 displayed on the display portion 3003b, a screen can be operated and text can be input. Needless to say, the display portion 3003a may function as a panel having a touch input function. The liquid crystal panel or the organic light-emitting panel described in Embodiment 4 is manufactured using the transistor 110 described in Embodiment 1 as a switching element and applied to the display portion 3003a or 3003b, whereby the portable information terminal can be obtained.

The portable information terminal illustrated in FIG. 12A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 12A may transmit and receive data wirelessly. Through wireless communication, desired book data or the like can be purchased and downloaded from an electronic book server.

Further, one of the two display portions 3003a and 3003b of the portable information terminal illustrated in FIG. 12A can be detached, for example, as shown in FIG. 12B. The display portion 3003a can be a panel having a touch-input function, which contributes to further reduction in weight when it is carried around and to the convenience since operation can be performed by one hand with the housing 3002 supported by the other hand.

Further, the housing 3002 illustrated in FIG. 12B may be equipped with an antenna, a microphone function, or a wireless function to be used as a mobile phone.

FIG. 12C illustrates an example of a mobile phone. A mobile phone 5005 illustrated in FIG. 12C is provided with a display portion 5001 incorporated in a housing, a display panel 5003 attached to a hinge 5002, operation buttons 5004, a speaker, a microphone, and the like.

In the mobile phone 5005 illustrated in FIG. 12C, the display panel 5003 is slid to overlap with the display portion 5001, and the display panel 5003 also functions as a cover having a light-transmitting property. The display panel 5003 is a display panel including the light-emitting element having a dual emission structure illustrated in FIG. 11B in Embodiment 4, in which light emission is extracted through the surface opposite to the substrate side and the surface on the substrate side.

Since the light-emitting element having a dual emission structure is used for the display panel 5003, display can also be performed with the display portion 5001 overlapped; therefore, both the display portion 5001 and the display panel 5003 can perform display and the users can view both the displays. The display panel 5003 has a light-transmitting property and the view beyond the display panel can be seen. For example, when a map is displayed on the display portion 5001 and the location points of users are displayed using the display panel 5003, the present location can be recognized easily.

Further, in the case where the mobile phone 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, users can make conversation while viewing the faces of two or more persons.

When a touch input button 5006 displayed on the display panel 5003 is touched with a finger or the like, data can be input into the mobile phone 5005. Further, the user can make a call or compose an e-mail by sliding the display panel 5003 and touching the operation buttons 5004 with a finger or the like.

FIG. 12D illustrates an example of a television set. In a television set 9600, a display portion 9603 is incorporated in a housing 9601. The display portion 9603 can display images. Here, the housing 9601 is supported on a stand 9605 provided with a CPU. When the transistor 111 described in Embodiment 2 is applied to the display portion 9603, the television set 9600 can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer or the like is possible. A disk storage medium is inserted into the storage medium recording and reproducing portion 9602, and reading data stored in the storage medium and writing data to the storage medium can be performed. In addition, a picture, a video, or the like stored as data in an external memory 9606 inserted to the external memory slot can be displayed on the display portion 9603.

The structures, methods, and the like described in this embodiment can be combined as appropriate with any of the structures, methods, and the like described in the other embodiments.

This application is based on Japanese Patent Application serial no. 2010-267908 filed with Japan Patent Office on Nov. 30, 2010, the entire contents of which are hereby incorporated by reference.

What is claimed is:

1. A semiconductor device comprising:
   a substrate;
   a base insulating layer over the substrate;
   an oxide semiconductor layer over the base insulating layer;
   a gate insulating layer over the oxide semiconductor layer; and
   a gate electrode layer over the gate insulating layer;
   wherein the oxide semiconductor layer has a concentration gradient of nitrogen, which becomes higher as closer to the gate insulating layer, and has a concentration gradient of oxygen, which becomes higher as closer to the base insulating layer.

2. The semiconductor device according to claim 1, wherein the oxide semiconductor layer is non-single-crystalline.

3. The semiconductor device according to claim 1, wherein a region of the oxide semiconductor layer in a vicinity of an interface with the gate insulating layer has higher crystallinity than other regions of the oxide semiconductor layer.

4. The semiconductor device according to claim 1, wherein a region of the oxide semiconductor layer in a vicinity of an interface with the gate insulating layer has a wurtzite crystal structure.

5. The semiconductor device according to claim 1, wherein a nitrogen concentration of the oxide semiconductor layer in a vicinity of an interface with the gate insulating layer is higher than or equal to $1\times10^{20}/cm^3$ and lower than 7 atomic %.

6. The semiconductor device according to claim 1, wherein a nitrogen concentration of the oxide semiconductor layer in a vicinity of an interface with the base insulating layer is higher than or equal to $1\times10^{17}/cm^3$ and lower than $5\times10^{19}/cm^3$.

7. A semiconductor device comprising:
   a substrate;
   a gate electrode layer over the substrate;
   a first insulating layer in contact with the gate electrode layer;
   an oxide semiconductor layer in contact with the first insulating layer; and
   a second insulating layer in contact with the oxide semiconductor layer,
   wherein the oxide semiconductor layer has a concentration gradient of nitrogen, which becomes higher as closer to the first insulating layer, and has a concentration gradient of oxygen, which becomes higher, as closer to the second insulating layer.

8. The semiconductor device according to claim 7, wherein the oxide semiconductor layer is non-single-crystalline.

9. The semiconductor device according to claim 7, wherein a region of the oxide semiconductor layer in a vicinity of an interface with the first insulating layer has higher crystallinity than other regions of the oxide semiconductor layer.

10. The semiconductor device according to claim 7, wherein a region of the oxide semiconductor layer in a vicinity of an interface with the first insulating layer has a wurtzite crystal structure.

11. The semiconductor device according to claim 7, wherein a nitrogen concentration of the oxide semiconductor layer in a vicinity of an interface with the first insulating layer is higher than or equal to $1\times10^{20}/cm^3$ and lower than 7 atomic %.

12. The semiconductor device according to claim 7, wherein a nitrogen concentration of the oxide semiconductor layer in a vicinity of an interface with the second insulating layer is higher than or equal to $1\times10^{17}/cm^3$ and lower than $5\times10^{19}/cm^3$.

13. A semiconductor device comprising:
   a substrate;
   a gate electrode layer over the substrate;
   a gate insulating layer over the gate electrode layer;
   an oxide semiconductor layer over the gate insulating layer; and
   a protective insulating layer over the oxide semiconductor layer;
   wherein the oxide semiconductor layer has a concentration gradient of nitrogen, which becomes higher as closer to the gate insulating layer, and has a concentration gradient of oxygen, which becomes higher as closer to the protective insulating layer.

14. The semiconductor device according to claim 13, wherein the oxide semiconductor layer is non-single-crystalline.

15. The semiconductor device according to claim 13, wherein a region of the oxide semiconductor layer in a vicinity of an interface with the gate insulating layer has higher crystallinity than other regions of the oxide semiconductor layer.

16. The semiconductor device according to claim 13, wherein a region of the oxide semiconductor layer in a vicinity of an interface with the gate insulating layer has a wurtzite crystal structure.

17. The semiconductor device according to claim 13, wherein a nitrogen concentration of the oxide semiconductor layer in a vicinity of an interface with the gate insulating layer is higher than or equal to $1\times10^{20}/cm^3$ and lower than 7 atomic %.

18. The semiconductor device according to claim 13, wherein a nitrogen concentration of the oxide semiconductor layer in a vicinity of an interface with the protective insulating layer is higher than or equal to $1\times10^{17}/cm^3$ and lower than $5\times10^{19}/cm^3$.

19. The semiconductor device according to claim 13, wherein a thickness of the protective insulating layer is greater than or equal to 50 nm.

20. The semiconductor device according to claim 13, further comprising a layer containing nitrogen between the gate electrode layer and the gate insulating layer,
   wherein the layer containing nitrogen is in contact with the gate insulating layer.

\* \* \* \* \*